United States Patent
Kim et al.

(10) Patent No.: US 7,348,246 B2
(45) Date of Patent: Mar. 25, 2008

(54) METHODS OF FABRICATING NON-VOLATILE MEMORY DEVICES INCLUDING DIVIDED CHARGE STORAGE STRUCTURES

(75) Inventors: Sung-min Kim, Incheon Metropolitan (KR); Dong-won Kim, Gyeonggi-do (KR); Eun-jung Yun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 65 days.

(21) Appl. No.: 11/268,034

(22) Filed: Nov. 7, 2005

(65) Prior Publication Data

US 2006/0097310 A1   May 11, 2006

(30) Foreign Application Priority Data

Nov. 8, 2004   (KR) .................. 10-2004-0090442

(51) Int. Cl.
*H01L 21/336* (2006.01)
(52) U.S. Cl. .................. 438/284; 438/401; 257/341; 257/E21.379; 257/E21.418; 257/E29.257
(58) Field of Classification Search ............... 438/266, 438/284, 287; 257/287, 341, 401, E21.39, 257/E21.418, E29.257
See application file for complete search history.

(56) References Cited

U.S. PATENT DOCUMENTS

| | | | |
|---|---|---|---|
| 6,657,252 B2 | 12/2003 | Fried et al. | |
| 6,844,589 B2 | 1/2005 | Kim | |
| 7,098,502 B2 * | 8/2006 | Mathew et al. | ............. 257/308 |
| 2003/0178670 A1 | 9/2003 | Fried et al. | |
| 2004/0207002 A1 | 10/2004 | Ryu et al. | |

* cited by examiner

Primary Examiner—Quoc Hoang
(74) Attorney, Agent, or Firm—Myers Bigel Sibley & Sajovec, PA

(57) ABSTRACT

A semiconductor memory device includes a substrate having first and second source/drain regions therein and a channel region therebetween. The device also includes first and second charge storage layers on the channel region, a first insulating layer on the channel region between the first and second charge storage layers, and a gate electrode on the insulating layer opposite the channel region and between inner sidewalls of the first and second charge storage layers. The gate electrode extends away from the substrate beyond the first and second charge storage layers. The device further includes second and third insulating layers extending from adjacent the inner sidewalls of the first and second charge storage layers along portions of the gate electrode beyond the first and second charge storage layers. Related methods of fabrication are also discussed.

10 Claims, 28 Drawing Sheets

US 7,348,246 B2

METHODS OF FABRICATING NON-VOLATILE MEMORY DEVICES INCLUDING DIVIDED CHARGE STORAGE STRUCTURES

CROSS-REFERENCE TO RELATED APPLICATION

This application claims priority from Korean Patent Application No. 10-2004-0090442, filed on Nov. 8, 2004, in the Korean Intellectual Property Office, the disclosure of which is incorporated by reference herein in its entirety.

FIELD OF THE INVENTION

The present invention relates to semiconductor memory devices, and more particularly, to non-volatile memory devices and methods of fabricating the same.

BACKGROUND OF THE INVENTION

Semiconductor memory devices that do not require power to maintain data stored therein are called non-volatile memory devices. Non-volatile memory devices may be widely used in mobile communication systems and/or memory cards due to such data storing capabilities.

Non-volatile memory devices having a Silicon-Oxide-Nitride-Oxide-Silicon (SONOS) structure have recently been developed. Non-volatile memory devices having a SONOS structure may offer many advantages over conventional devices, such as reduced manufacturing complexity and flexibility in forming peripheral and/or logic regions in integrated circuit devices.

FIGS. 1 through 3 are cross-sectional views illustrating conventional SONOS-type non-volatile memory devices. Referring to FIG. 1, a first SONOS non-volatile memory device 1 includes an oxide-nitride-oxide (ONO) film 14 between source/drain regions 12 in a silicon substrate 10. The ONO film includes a tunnel oxide film 15, a nitride film 16, and a control oxide film 17. A control gate 18 is formed on the control oxide film 17. The nitride film 16 may function as a charge trap layer to trap charges which may penetrate through the tunnel oxide film 15. The control oxide film 17 may impede penetration of charges stored in the nitride film 16 into the control gate 18.

Still referring to FIG. 1, when a voltage is applied to the control gate 18, charges (such as electrons and/or holes) may migrate toward the tunnel oxide film 15 between the source/drain regions 12. More specifically, when a positive voltage is applied to the control gate 18, electrons may migrate from the semiconductor substrate 10 and become trapped in a first region 20 of the nitride film 16. On the other hand, when a negative voltage is applied to the control gate 18, holes may migrate from the semiconductor substrate 10 and become trapped in the first region 20. However, in either case, charges may accumulate around the drain, which may be biased at a higher voltage than the source. In particular, when the drain is located below a right side of the nitride film 16, as shown in FIG. 1, charges may accumulate in the first region 20 near the drain.

The charges accumulated in the first region 20 can alter the threshold voltage Vth of the non-volatile memory device. The first SONOS device 1 may have a relatively high initial threshold voltage and program current since the ONO film 14 is formed along the entire channel region.

Referring to FIG. 2, a second SONOS device 2 includes an ONO film 34 between source/drain regions 32 in a silicon substrate 30. The ONO film 34 includes a tunnel oxide film 35, a nitride film 36, and a control oxide film 37. A control gate 38 is formed on the control oxide film 37. The nitride film 36 includes two separate portions with a dielectric film 38 therebetween. The second SONOS device 2 including the separated nitride film 36 is called a localized SONOS device. As such, the localized SONOS device is a 2-bit non-volatile memory device that can store 2 bits of information (one bit in each portion of the separated nitride film) by including two ONO layers under a single gate electrode.

Localized SONOS devices may have reduced program current and increased reading speed, since the trapped charges may be locally confined in each portion of the separated nitride film 36. However, localized SONOS devices may still have a relatively high initial threshold voltage, since the tunnel oxide film 35, the dielectric film 38, and the control oxide film 37 are formed across the entire channel region.

Referring to FIG. 3, a third SONOS device 3 includes an ONO film 54 between source/drain regions 52 in a silicon substrate 50. The ONO film 54 includes a tunnel oxide film 55, a nitride film 56, and a control oxide film 57. A control gate 60 is formed on the control oxide film 57. The ONO film 54 is divided into two portions by a separation oxide film 58. The third SONOS device 3 may have a reduced threshold voltage, since the control gate 60 on the separation oxide film 58 is disposed on a greater portion of the channel region, which may allow for greater control thereof.

However, as semiconductor memory devices are continually scaled-down, conventional 2-bit non-volatile memory devices may not be easily reduced in size.

SUMMARY OF THE INVENTION

According to some embodiments of the present invention, a semiconductor memory device includes a substrate having first and second source/drain regions therein and a channel region therebetween, first and second charge storage layers on the channel region, and a first insulating layer on the channel region between the first and second charge storage layers. The device also includes a gate electrode on the first insulating layer opposite the channel region and between inner sidewalls of the first and second charge storage layers. The gate electrode extends away from the substrate beyond the first and second charge storage layers. The device further includes second and third insulating layers extending from adjacent the inner sidewalls of the first and second charge storage layers along portions of the gate electrode beyond the first and second charge storage layers.

In some embodiments, the first, second, and third insulating layers may form a continuous insulating layer. The first, second, and third insulating layers may be oxide layers.

In some embodiments, the first and second charge storage layers may be first and second oxide-nitride-oxide (ONO) layers on the channel region adjacent opposing sidewalls of the gate electrode. The first and second ONO layers may each include a tunnel oxide layer on the channel region, a nitride charge trapping layer on the tunnel oxide layer, and a control oxide layer on the nitride charge trapping layer. The second and third insulating layers may be on the respective opposing sidewalls of the gate electrode adjacent the first and second ONO layers to define an insulated lower gate electrode separating the first and second ONO layers.

In other embodiments, the gate electrode may be a lower gate electrode. The device may further include first and second control gate electrodes on the respective first and second charge storage layers, and an upper gate electrode on the lower gate electrode between the first and second control gate electrodes. The second insulating layer may be between the first control gate electrode and the lower gate electrode, and the third insulating layer may be between the second control gate electrode and the lower gate electrode. The upper gate electrode may extend from the lower gate electrode beyond the first and second control gate electrodes.

According to further embodiments of the present invention, a semiconductor memory device includes a semiconductor substrate, a fin-shaped active region protruding from the substrate and having first and second source/drain regions therein and a channel region therebetween, and first and second charge storage layers on opposing sidewalls of the channel region and on a surface therebetween. The device also includes an insulating layer on the opposing sidewalls and the surface therebetween of the channel region and between the first and second charge storage layers, and a gate electrode on the insulating layer opposite the channel region on the opposing sidewalls and the surface therebetween of the channel region.

In some embodiments, the insulating layer may be a first insulating layer between the channel region and the gate electrode. The device may further include second and third insulating layers extending from adjacent inner sidewalls of the first and second charge storage layers along portions of the gate electrode beyond the first and second charge storage layers.

In other embodiments, the first and second charge storage layers may be first and second oxide-nitride-oxide (ONO) layers on the opposing sidewalls and the surface therebetween of the channel region adjacent opposing sidewalls of the gate electrode. The second and third insulating layers may be on the respective opposing sidewalls of the gate electrode adjacent the first and second ONO layers to define an insulated lower gate electrode separating the first and second ONO layers. The insulated lower gate electrode may extend from the channel region beyond the first and second ONO layers.

In some embodiments, the gate electrode may be a lower gate electrode. The device may further include first and second control gate electrodes on the respective first and second charge storage layers on the opposing sidewalls and the surface therebetween of the channel region, and an upper gate electrode on the lower gate electrode between the first and second control gate electrodes. The upper gate electrode may extend from the lower gate electrode beyond the first and second control gate electrodes. The device may further include a device isolation layer on the substrate at a base of the fin-shaped active region and on lower sidewalls of thereof. The lower gate electrode, the first and second charge storage layers, and the first and second control gate electrodes may be on the device isolation layer at the base of the fin-shaped active region.

According to some embodiments of the present invention, a method of fabricating a semiconductor memory device includes forming first and second charge storage layers on a channel region between first and second source/drain regions in a semiconductor substrate. A first insulating layer is formed on the channel region between the first and second charge storage layers, and second and third insulating layers are formed extending from adjacent inner sidewalls of the first and second charge storage layers beyond the first and second charge storage layers. A gate electrode is formed on the first insulating layer opposite the channel region and between the inner sidewalls of the first and second charge storage layers. The gate electrode extends away from the substrate beyond the first and second charge storage layers.

In some embodiments, the first, second, and third insulating layers form a continuous insulating layer. The first, second, and third insulating layers may be formed simultaneously.

In other embodiments, the first and second charge storage layers may be formed by forming first and second oxide-nitride-oxide (ONO) layers on the channel region on opposing sidewalls of the gate electrode. The second and third insulating layers may be formed on the respective opposing sidewalls of the gate electrode adjacent the first and second ONO layers to form an insulated lower gate electrode separating the first and second ONO layers.

In some embodiments, the gate electrode may be a lower gate electrode. The method may further include forming first and second control gate electrodes on the respective first and second charge storage layers. An upper gate electrode may be formed on the lower gate electrode between the first and second control gate electrodes.

In other embodiments, the second and third insulating layers may be formed by oxidizing inner sidewalls of the first and second control gate electrodes. The upper gate electrode may be formed to extend from the lower gate electrode beyond the first and second control gate electrodes.

In some embodiments, the first and second charge storage layers and the first and second control gate electrodes may be formed by forming a charge storage layer pattern on the channel region, and forming a gate electrode pattern on the charge storage layer pattern. A middle portion of the gate electrode pattern and a middle portion of the charge storage layer pattern therebeneath may be removed to define the first and second charge storage layers and the first and second control gate electrodes.

In other embodiments, the middle portion of the gate electrode pattern and the middle portion of the charge storage layer pattern may be removed by forming a mask pattern on the middle portion of the gate electrode pattern and uniformly reducing the mask pattern to form a reduced mask pattern having a predetermined width. An interlayer insulating layer may be formed on the gate electrode pattern at opposite sides of the mask pattern, and the mask pattern may be removed to form trench defined by the interlayer insulating layer and exposing the middle portion of the gate electrode pattern. The middle portion of the gate electrode pattern and the middle portion of the charge storage layer pattern therebeneath may be etched to define the first and second charge storage layers and the first and second control gate electrodes.

In some embodiments, the substrate may include a fin-shaped active region protruding therefrom. The fin-shaped active region may include the first and second source/drain regions therein and the channel region therebetween. The first and second charge storage layers may be formed on opposing sidewalls of the channel region and on a surface therebetween. The first insulating layer may be formed on the opposing sidewalls and the surface therebetween of the channel region, between the first and second charge storage layers. The gate electrode may be formed on the first insulating layer on the opposing sidewalls and the surface therebetween of the channel region and separating the first and second charge storage layers.

DETAILED DESCRIPTION OF EMBODIMENTS OF THE INVENTION

Figure 1:
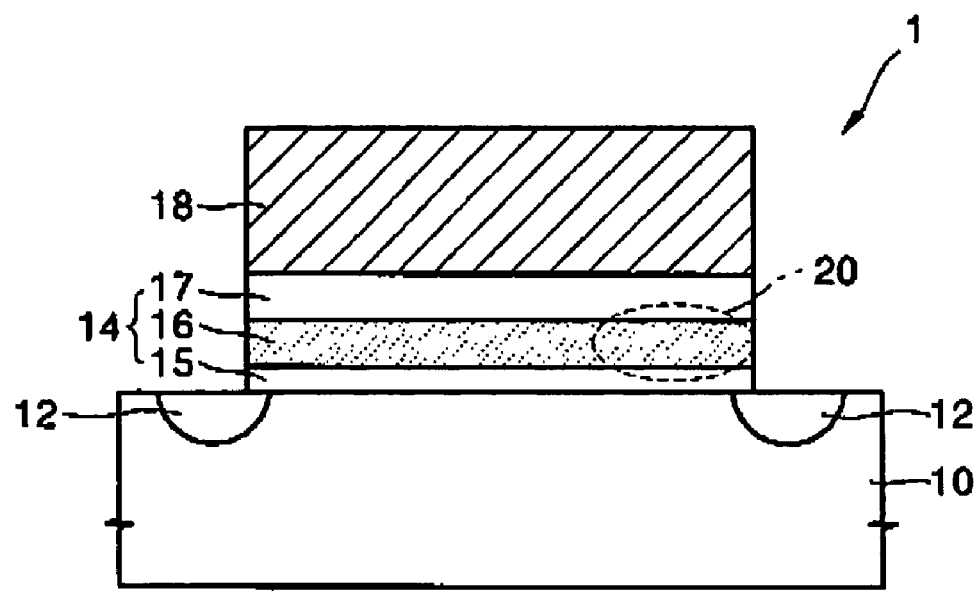
FIG. 1 is a cross-sectional view of a conventional SONOS type non-volatile memory device.
Figure 2:
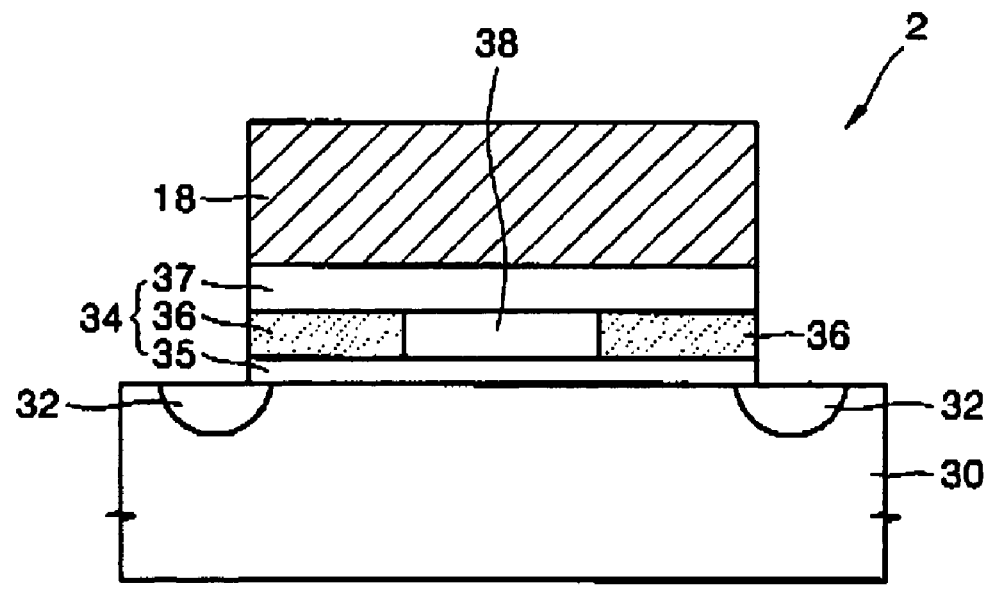
FIG. 2 is a cross-sectional view of another conventional SONOS type non-volatile memory device.
Figure 3:
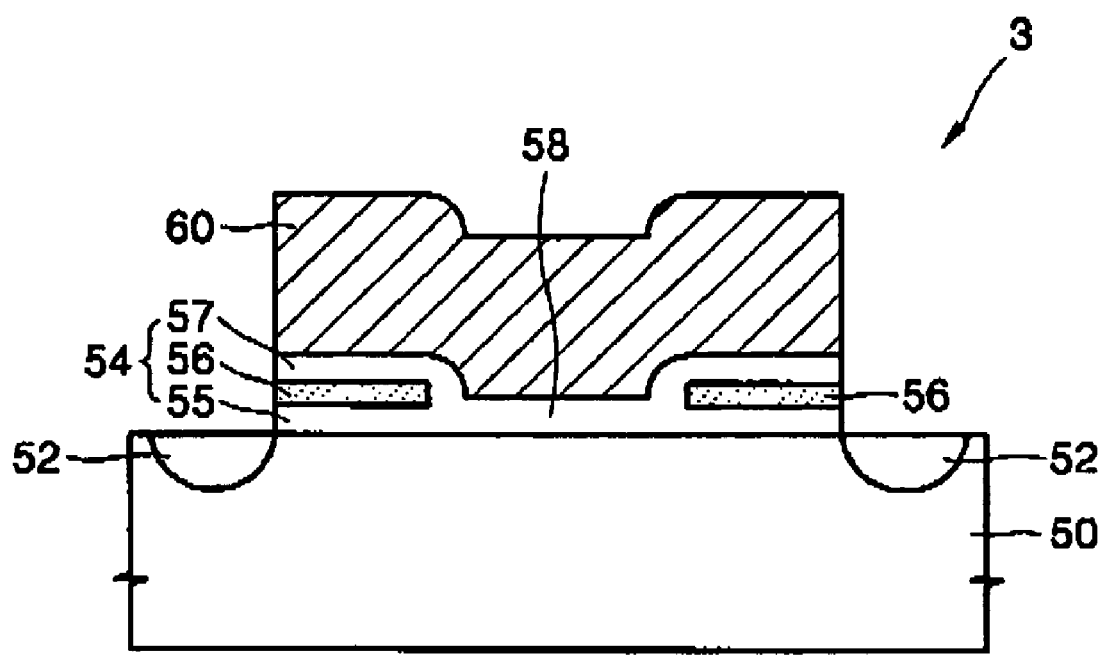
FIG. 3 is a cross-sectional view of yet another conventional SONOS type non-volatile memory device.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

As semiconductor memory devices become more highly integrated, the channel length of the devices may be reduced, which may result in a variety of operational and/or structural problems. Such problems may include short channel effects, problems related to forming fine patterns, and limited drive current. In particular, short channel effects may pose serious problems. For example, an increase in electric field intensity in the vicinity of the drain may generate punch-through, in which the depletion region of the drain may penetrate the potential barrier near the source. In addition, thermal electrons generated in the short channel may result in avalanche breakdown, and increases in the vertical electric field may reduce charge mobility.

Therefore, to address problems associated with short channel effects, attempts have been made to increase the channel length. For example, channel length has been increased by extending the channel in a vertical direction with respect to a substrate. A structure having such a vertically protruding channel is referred to as a FinFET. Semiconductor memory devices according to some embodiments of the present invention having a FinFET structure will now be described.

Figure 4A:
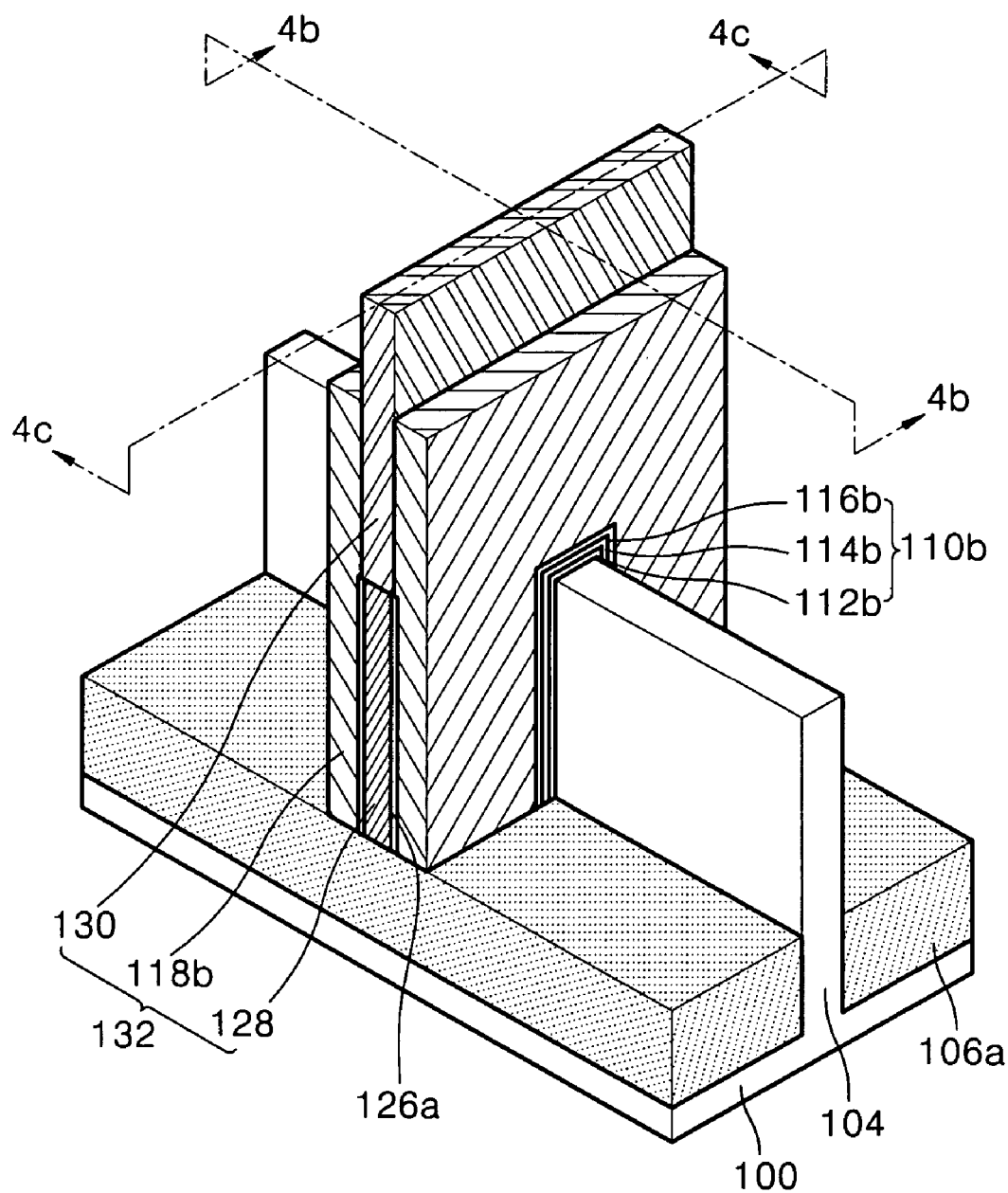
FIG. 4A is a perspective view of a SONOS device having a FinFET structure according to some embodiments of the present invention.
Figure 4B:
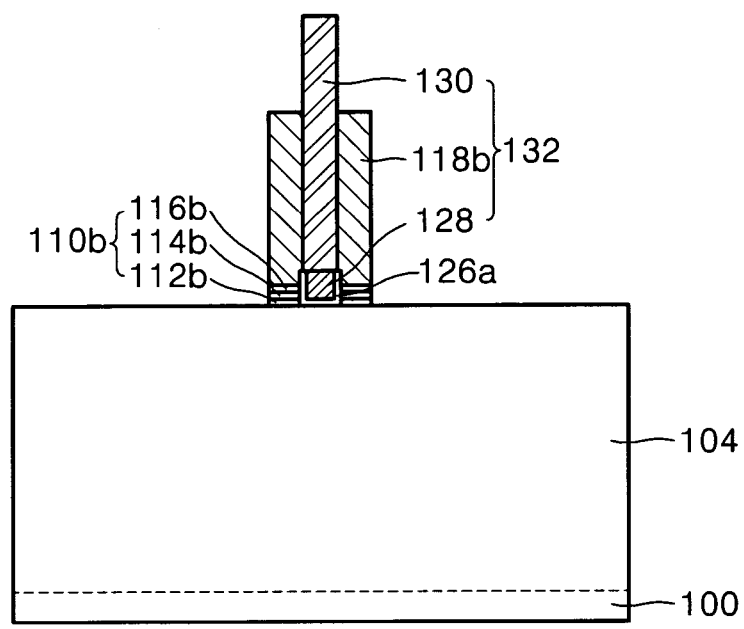
FIG. 4B is a cross-sectional view taken along line 4b-4b of FIG. 4A.
Figure 4C:
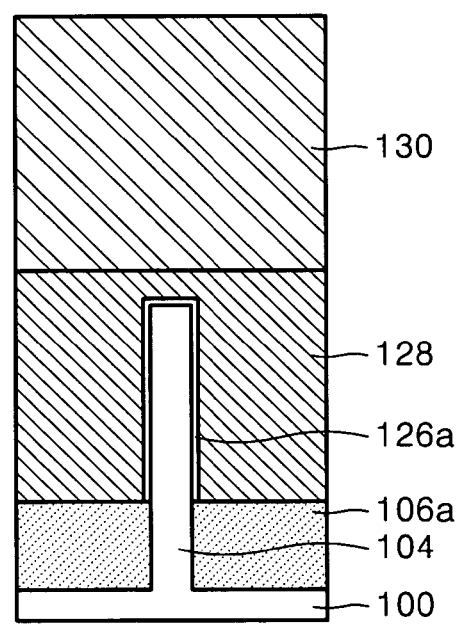
FIG. 4C is a cross-sectional view taken along line 4c-4c of FIG. 4A.

FIG. 4A is a perspective view and FIGS. 4B and 4C are cross-sectional views of a SONOS device having a FinFET structure according to some embodiments of the present invention. Referring to FIGS. 4A through 4C, the SONOS device includes a semiconductor substrate 100, a fin-shaped active region (or fin) 104 vertically protruding from the semiconductor substrate 100, and a gate structure including a control gate 132 on both sidewalls and an upper surface of the fin 104. A recessed device isolation film 106a is formed between the semiconductor substrate 100 and the gate structure on both sides of the fin 104.

The gate structure includes charge storage layers, such as ONO film patterns 110b, extending around the channel region of the fin 104; an insulating layer, such as thermal oxide film pattern 126a, on the channel region therebetween; and the control gate 132. The ONO patterns 110b are formed on an upper surface and sidewalls of the fin 104 between the fin 104 and the control gate 132. The ONO patterns 110b include first and second ONO layers separated by the thermal oxide film pattern 126a. As such, the thermal oxide film pattern 126a covers both sidewalls and the upper surface of the fin 104, and is positioned between the first and second ONO layers and on adjacent sidewalls thereof.

The first control gate 132 includes a lower gate electrode pattern 128 covered on both sidewalls thereof and separated from the fin 104 by the thermal oxide film pattern 126a to form an insulated gate electrode. Divided control gate electrode patterns 118b are formed on the first and second ONO layers at both sidewalls of the lower gate electrode pattern 128. An upper gate electrode pattern 130 for external electrical connection is formed on the lower gate electrode pattern 128 between the divided gate electrode patterns 118b. The upper gate electrode pattern 130 may extend from the substrate beyond the divided gate electrode patterns 118b. The control gate 132 can thus include the divided gate electrode patterns 118b, the lower gate electrode pattern 128, and the upper gate electrode pattern 130.

The lower gate electrode pattern 128 extends around the channel region of the fin 104 on both sidewalls and the upper surface thereof between the first and second ONO layers. The thermal oxide film pattern 126a covers both sidewalls and a surface therebetween of the lower gate electrode pattern 128, and extends from the channel region beyond the ONO stacks. The thermal oxide film pattern 126a thereby separates the lower gate electrode 128 from the fin 104. The divided gate electrode pattern 118b is also formed on both sidewalls and the upper surface of the fin 104 on the first and second ONO layers at opposite sides of the lower gate electrode pattern 128. The ONO film patterns 110b each include a tunnel oxide film pattern 112b, a charge trapping nitride pattern 114b, and a control oxide film pattern 116b.

The lower gate electrode pattern 128 can extend from the isolation film 106a beyond the fin 104 and/or the ONO film patterns 110b to cover the upper surface and both sidewalls of the fin 104. Thus, a relatively uniform threshold voltage can be maintained.

Exemplary operations of a SONOS memory device according to some embodiments of the present invention will now be described. When a voltage is applied to the first control gate 132, charges (such as electrons or holes) may be injected through the tunnel oxide film pattern 112b formed on the fin 104 into the nitride pattern 114b. More specifically, when a positive voltage is applied to the control gate 132, electrons may migrate from the fin 104 and may become trapped in the charge trapping nitride film pattern 114b of the first and/or second ONO layers. Alternatively, when a negative voltage is applied to the control gate 132, holes may migrate from the fin 104 and may be trapped in the charge trapping nitride film pattern 14b of the first and/or second ONO layers. As such, in either case, two bits of information can be stored.

Figure 5:
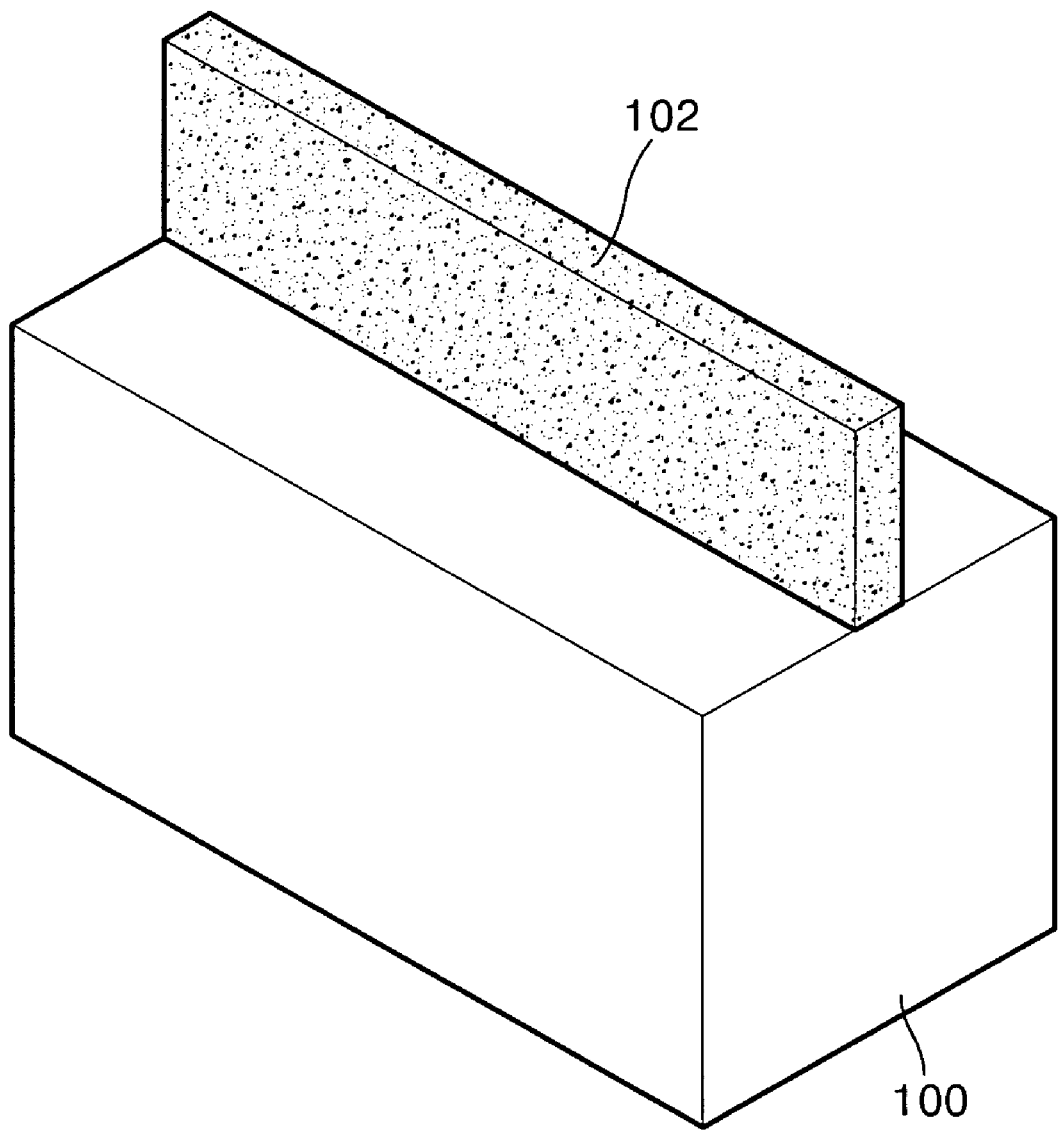
FIGS. 5 through 17 are perspective views illustrating intermediate steps of fabricating SONOS devices having a FinFET structure as shown in FIG. 4A.
Figure 6:
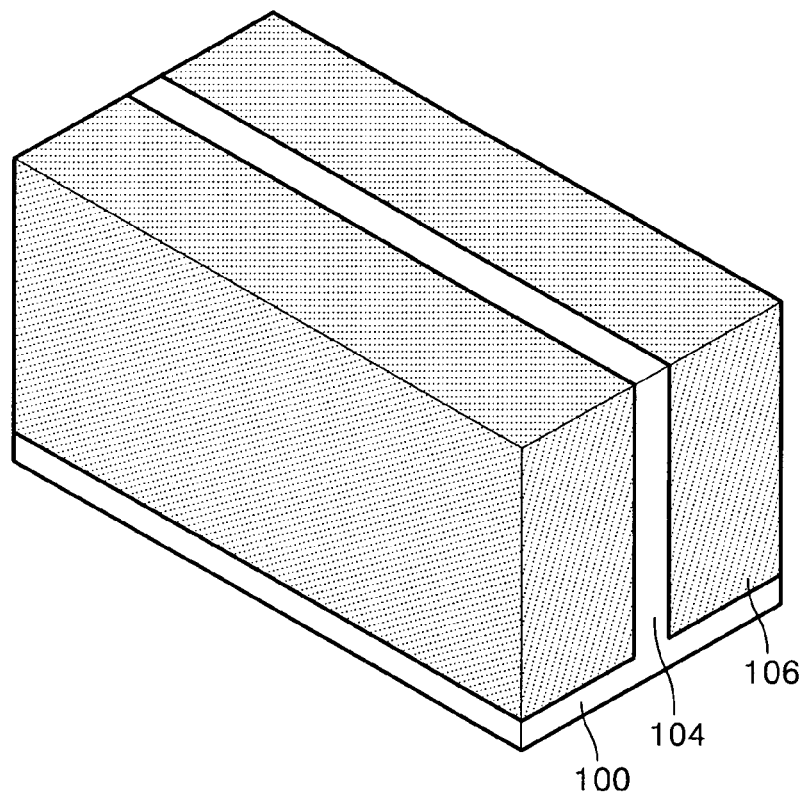

FIGS. 5 through 17 are perspective views illustrating exemplary intermediate fabrication steps in methods of fabricating SONOS devices having a FinFET structure according to the some embodiments of the present invention. Referring now to FIG. 5, a first photoresist pattern 102 to define a fin-shaped protrusion is formed on a semiconductor substrate 100. Referring to FIG. 6, a fin-shaped active region, or fin 104, is formed by etching the semiconductor substrate 100 to a predetermined depth using the first photoresist pattern 102 as an etch mask. Next, after removing the first photoresist pattern 102, the recessed region is filled with a device isolation film 106. The first photoresist pattern 102 can be removed by oxygen plasma ashing and/or resist stripping. The fin 104 may have a rectangular or cylindrical cross-section and/or may have a rounded upper surface.

The device isolation film 106 can be an insulating film such as a undoped silica glass (USG) film, a high density plasma (HDP) oxide film, a tetraethyl ortho-silicate (TEOS) film formed using a plasma-enhanced chemical vapor deposition (PECVD) method, an oxide film formed using a PECVD method, and/or some combination thereof. For example, in some embodiments, a HDP oxide film may be suitable for the device isolation film 106. A HDP CVD process is a deposition technique combining CVD and a sputtering method to form the HDP oxide film. In a HDP CVD process, a deposition gas (for depositing film material) and a sputtering gas (for etching the film material) may be supplied to the chamber. In some embodiments, $SiH_4$ and $O_2$ may be supplied to the chamber as deposition gases, and an inert gas, such as Ar, may be supplied to the chamber as a sputtering gas. At least a portion of the deposition gas and the sputtering gas may then be ionized in the chamber by plasma generated using radio frequency (RF) power. The ionized deposition gas and the sputtering gas may be accelerated toward a surface of the semiconductor substrate 100 when biased RF power is applied to a wafer chuck, such as an electrostatic chuck. The accelerated deposition gas ions may form a silicon oxide film, and the accelerated sputtering gas ions may be sputtered on the deposited silicon oxide film. Accordingly, if a HDP oxide film is formed as the device isolation film 106, the HDP oxide film may have a relatively high ion concentration and/or superior gap fill characteristics when deposition is performed in the aforementioned manner.

Figure 7:
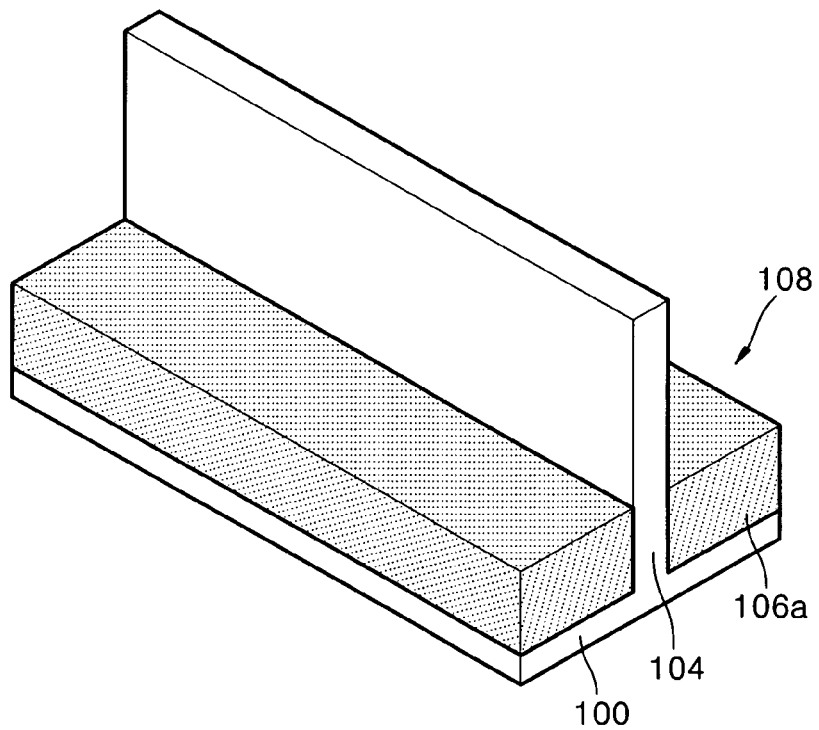

Referring now to FIG. 7, recess regions 108 exposing portions of both sidewalls of the fin 104 may be formed by anisotropically dry etching the device isolation film 106 to a predetermined depth, based on an etch selectivity of the fin 104 with respect to the device isolation film 106. Alternatively, the device isolation film 106 can be removed using a diluted HF solution, a diluted NHF solution, and/or a buffered oxide etchant (BOE), which may be a mixture of HF and deionized (DI) water.

The recess regions 108 can also be formed by forming a photoresist pattern (not shown) that covers an upper surface of the fin 104 and etching the device isolation films 106 on both sides of the fin 104 using the photoresist pattern as an etch mask. The device isolation film 106 can also be dry etched, for example, using plasma etching and/or reactive ion etching. As such, a recessed device isolation film 106a is formed.

The etching depth of the device isolation film 106 may determine the channel area of the semiconductor memory device. For example, if the etching depth is relatively deep, gap filling in a subsequent process may be difficult. Alternatively, if the etching depth is too shallow, the area of the channel region may be reduced. Therefore, the depth of the recessed region 108 may be based on desired device isolation effects and/or desired channel area.

Figure 8:
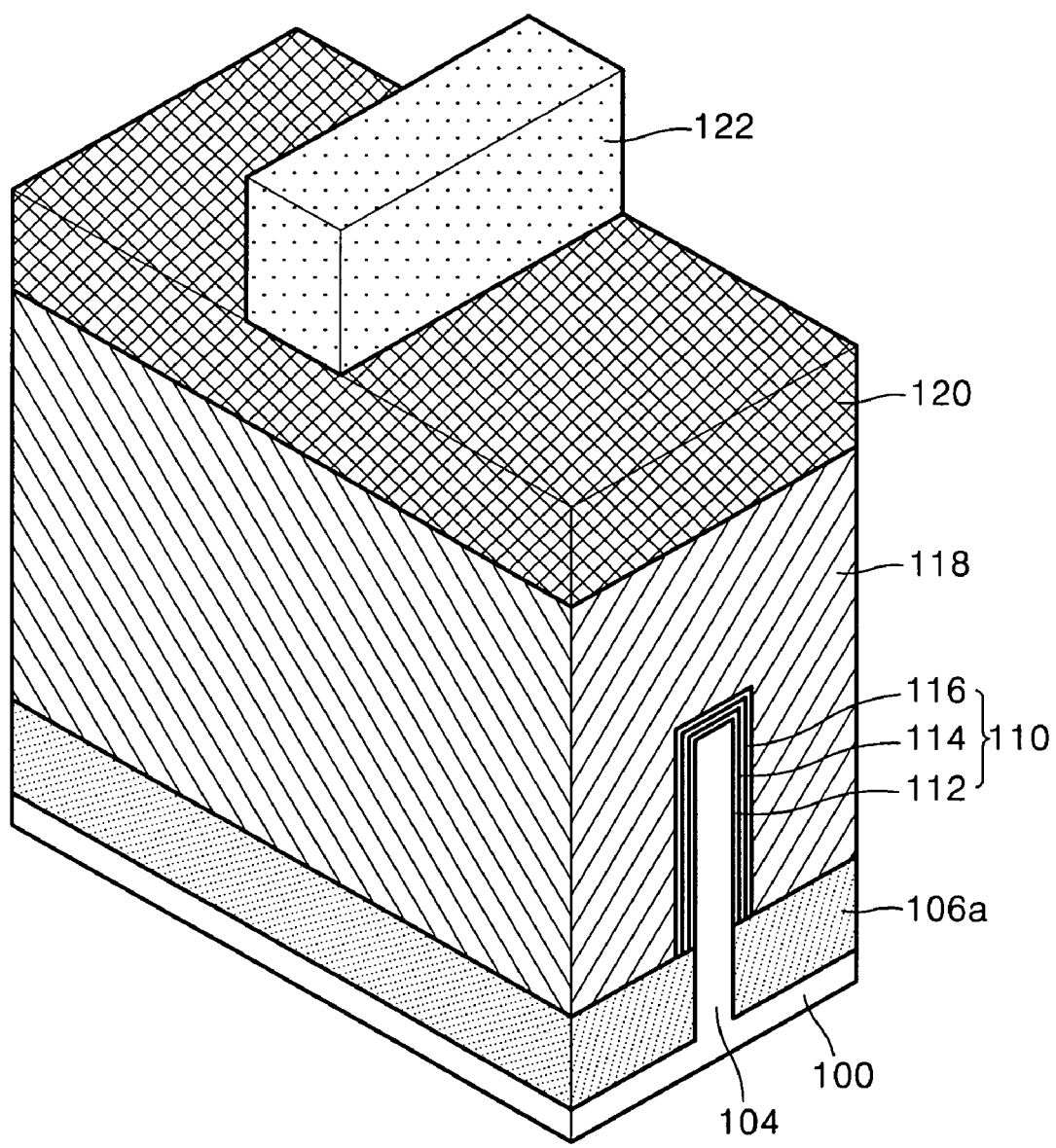

Referring now to FIG. 8, both sidewalls and the upper surface of the fin 104 are covered by an ONO film 110 including a tunnel oxide film 112, a charge trapping nitride film 114, and a control oxide film 116 which are sequentially stacked. The tunnel oxide film 112, the charge trapping nitride film 114, and the control oxide film 116 may be deposited to thicknesses in the range of about 30 Å to about 80 Å, about 30 Å to about 100 Å, and about 50 Å to about 100 Å, respectively. The tunnel oxide film 112 and the control oxide film 116 can be formed by thermal oxidation, and the charge trapping nitride film 114 can be formed by Chemical Vapor Deposition (CVD), Sub-Atmospheric CVD (SACVD), Low Pressure CVD (LPCVD) and/or Plasma Enhanced CVD (PECVD).

The tunnel oxide film 112 is an insulating film through which electrical charges may tunnel. The charge trapping nitride film 114 is an insulating film in which electrical charges may be trapped. The control oxide film 116 is an insulating film that may impede leakage of the trapped electrical charges. The ONO film 110 is formed on both sidewalls of the fin 104 and the upper surface therebetween, leaving a portion of the upper surface of the recessed device isolation film 106a exposed.

Next, the exposed portion of the recessed device isolation film 106a and both sidewalls and the upper surface of the fin 104 including the ONO film 110 thereon are covered by a gate electrode material layer 118. The gate electrode material layer 118 can be a single layer or a multi-layer stack formed of amorphous polysilicon, doped polysilicon, poly-SiGe, and/or other material including a conductive metal, such as tungsten, molybdenum, and/or a conductive metal nitride (such as titanium nitride, tantalum nitride, and/or tungsten nitride).

Next, after planarizing the gate electrode material layer 118 using CMP and/or an etch-back process, a nitride film 120 for use as a hard mask layer is formed on the gate electrode material layer 118. A second photoresist pattern 122 used during an etch of the layers thereunder to a predetermined depth is then formed on the nitride film 120.

Figure 9:
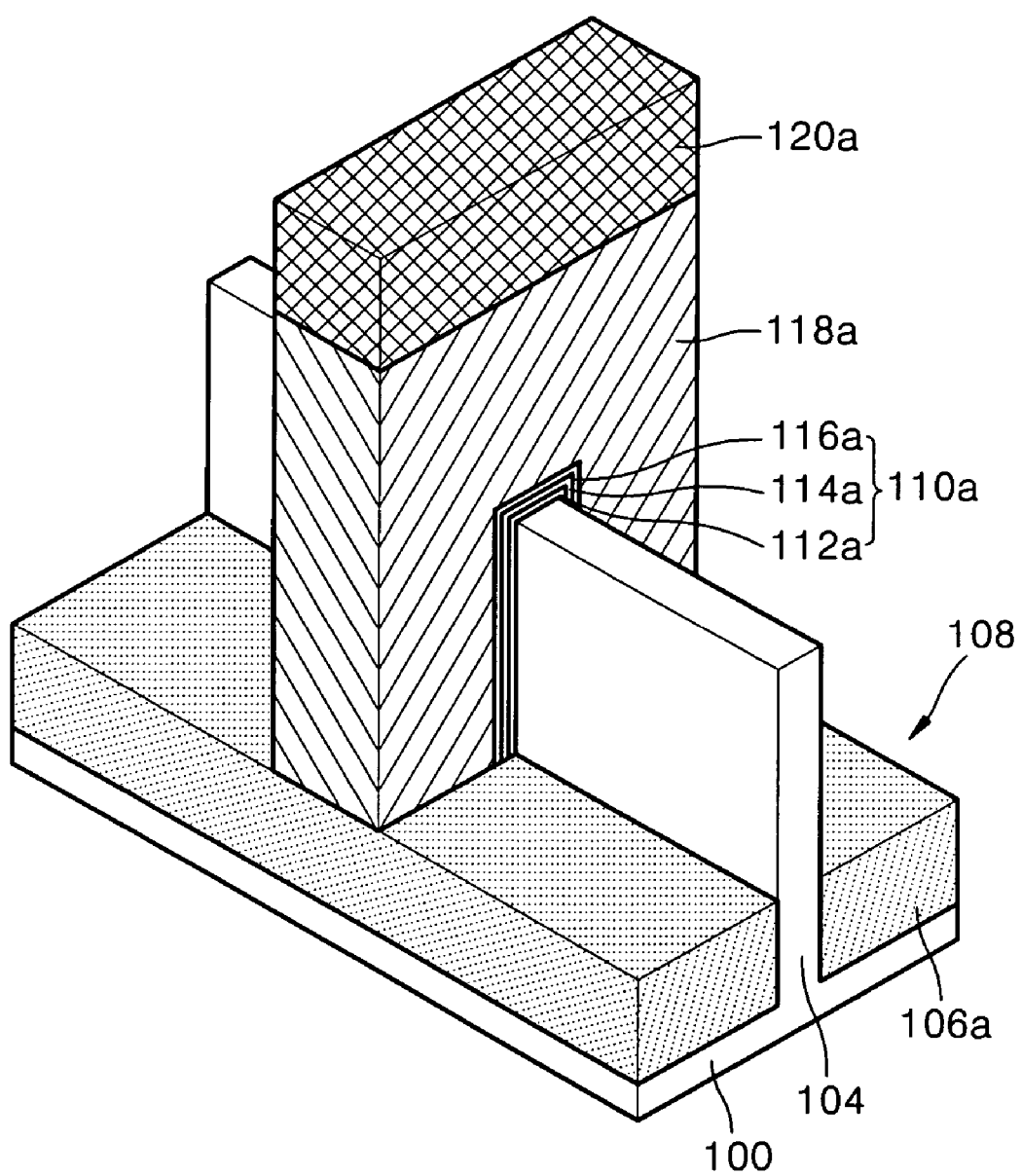

Referring to FIG. 9, a hard mask pattern 120a, a gate electrode pattern 118a, and an ONO film pattern 110a are formed by etching the nitride film 120, the gate electrode material layer 118, and the ONO film 110 using the second photoresist pattern 122 as an etch mask. More specifically, the nitride film 120 and the charge trapping nitride film 114 can be removed using phosphoric acid ($H_3PO_4$). The gate electrode material layer 118 can be removed using a solution of $H_2O_2$, HF, and/or $CH_3COOH$; an etching solution including peracetic acid; or a SC1 solution. The tunnel oxide film 112 and the control oxide film 116 can be removed using a BOE, which may be a solution of diluted HF or $NH_4F$, HF and DI water.

Figure 10:
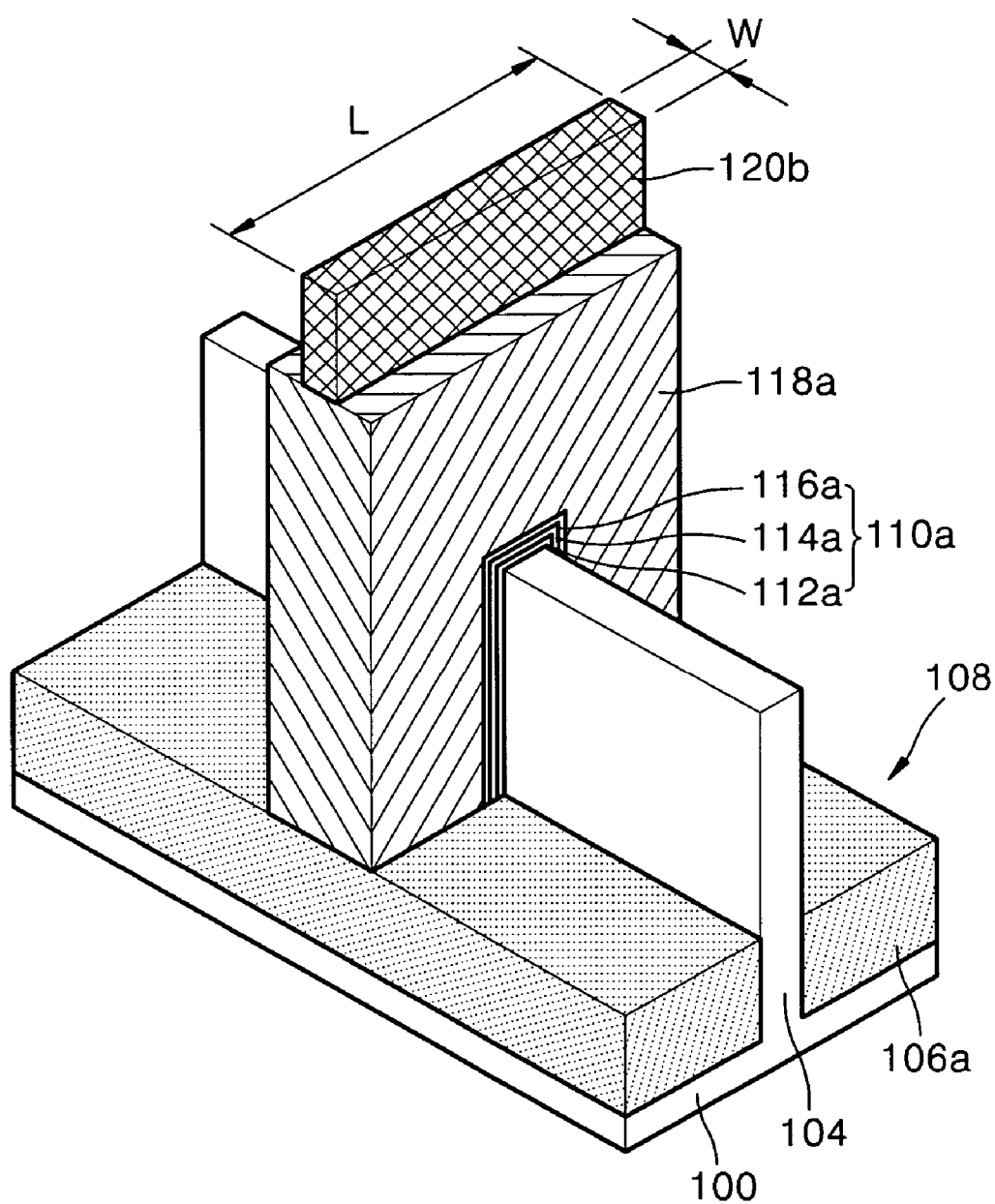

Referring to FIG. 10, a reduced hard mask pattern 120b may be formed by removing portions of the hard mask pattern 120a using a blanket etching process such as etchback, and/or an isotropic etching process using a phosphate. When blanket etching and/or isotropic etching is performed, the hard mask pattern 120a may be uniformly reduced along a width W and/or a length L direction. In particular, the width W of the reduced hard mask pattern 120b may determine a distance between the first and second ONO film patterns 110b, which will be described with reference to FIG. 13.

Figure 11:
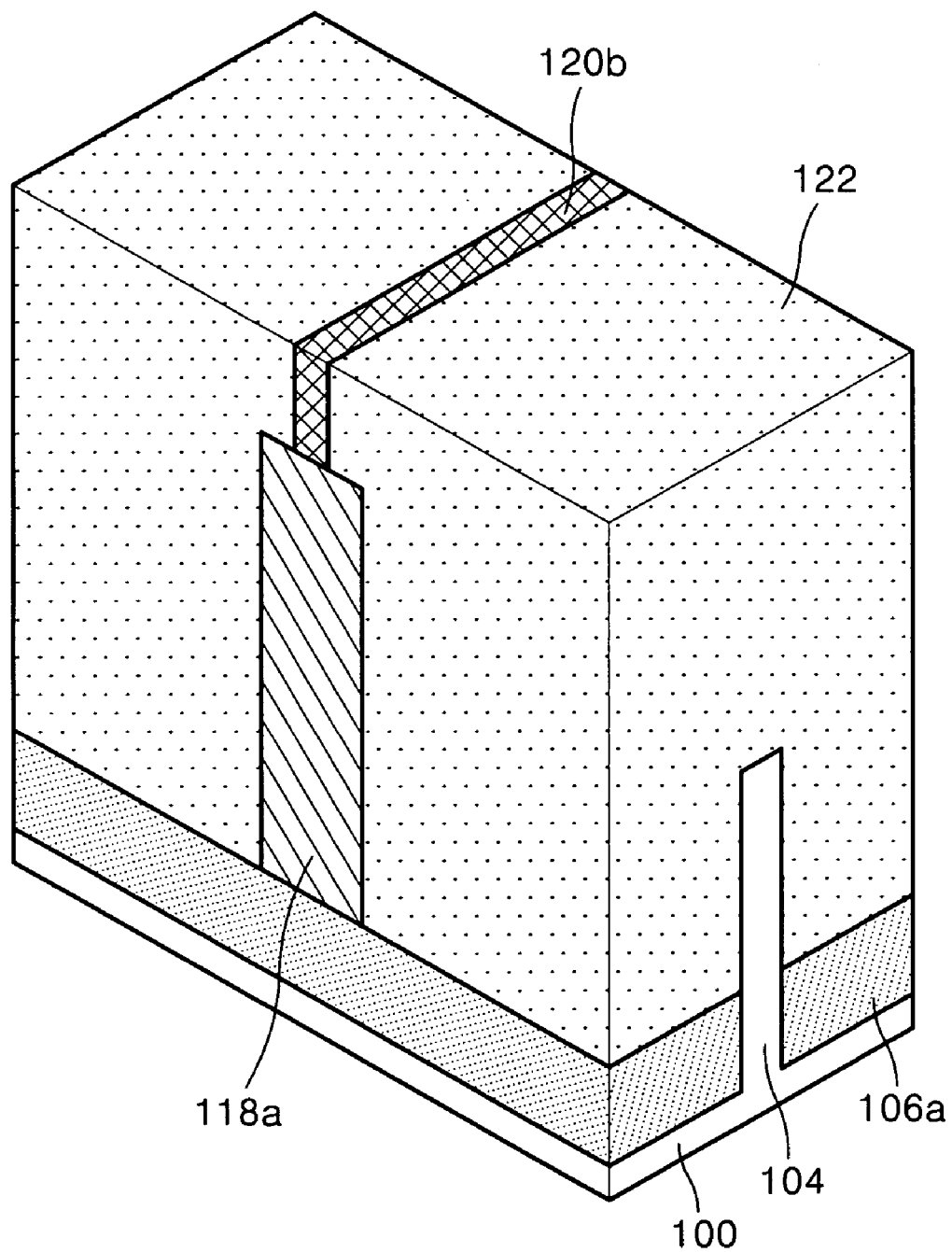

Referring now to FIG. 11, an interlayer insulating layer 122 may be formed on both sidewalls of the hard mask pattern 120b, the gate electrode pattern 118a, the fin 104, and on the recessed device isolation film 106a. The interlayer insulating layer 122 may be an insulating layer such as a USG film, a HDP oxide film, a TEOS film formed using PECVD, an oxide film formed using PECVD, and/or a combination thereof. For example, a HDP oxide film may be suitable for forming the interlayer insulating layer 122 in some embodiments. The interlayer insulating layer 122 may function not only as an electrical insulator, but also as a device isolation layer.

Figure 12:
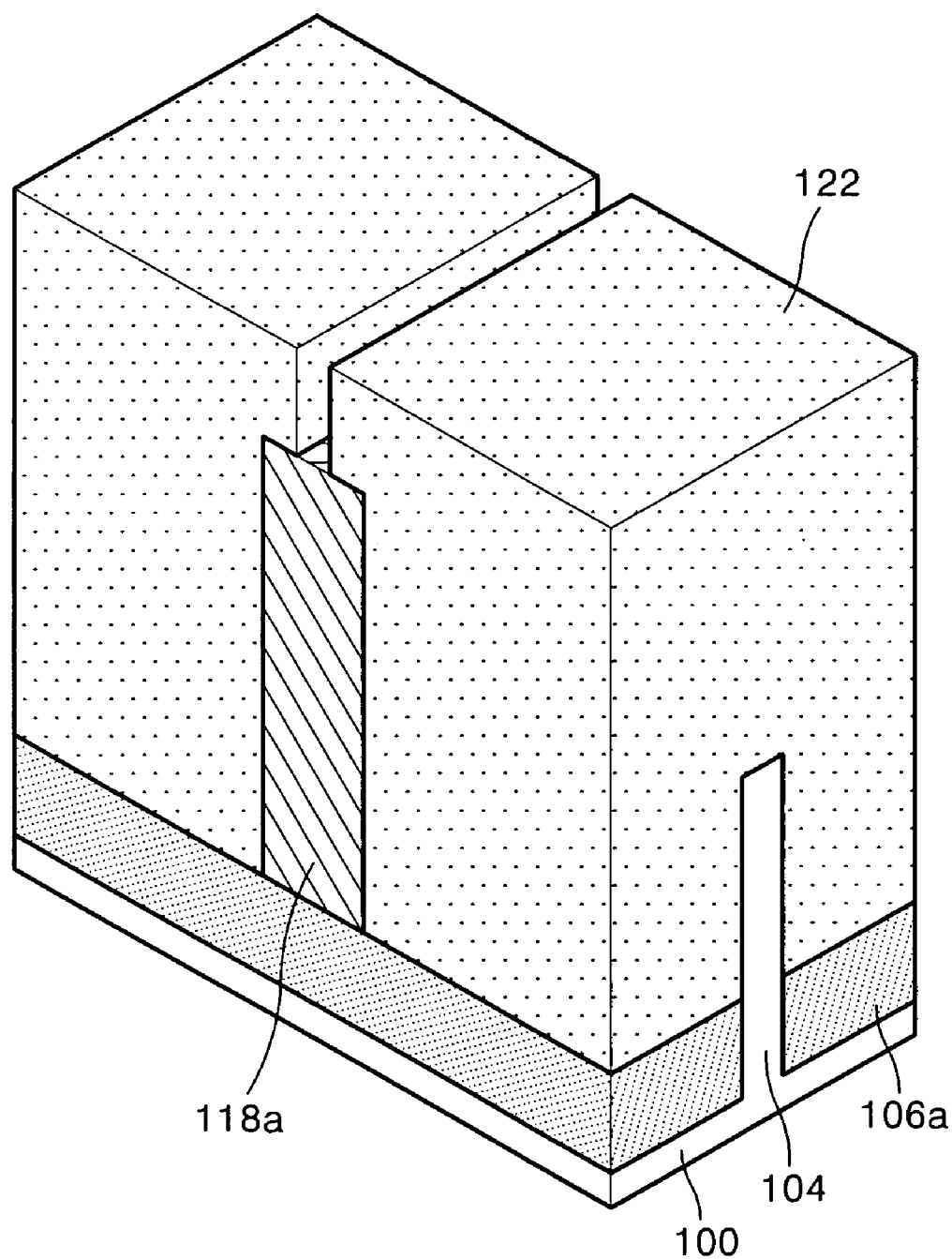
Figure 13:
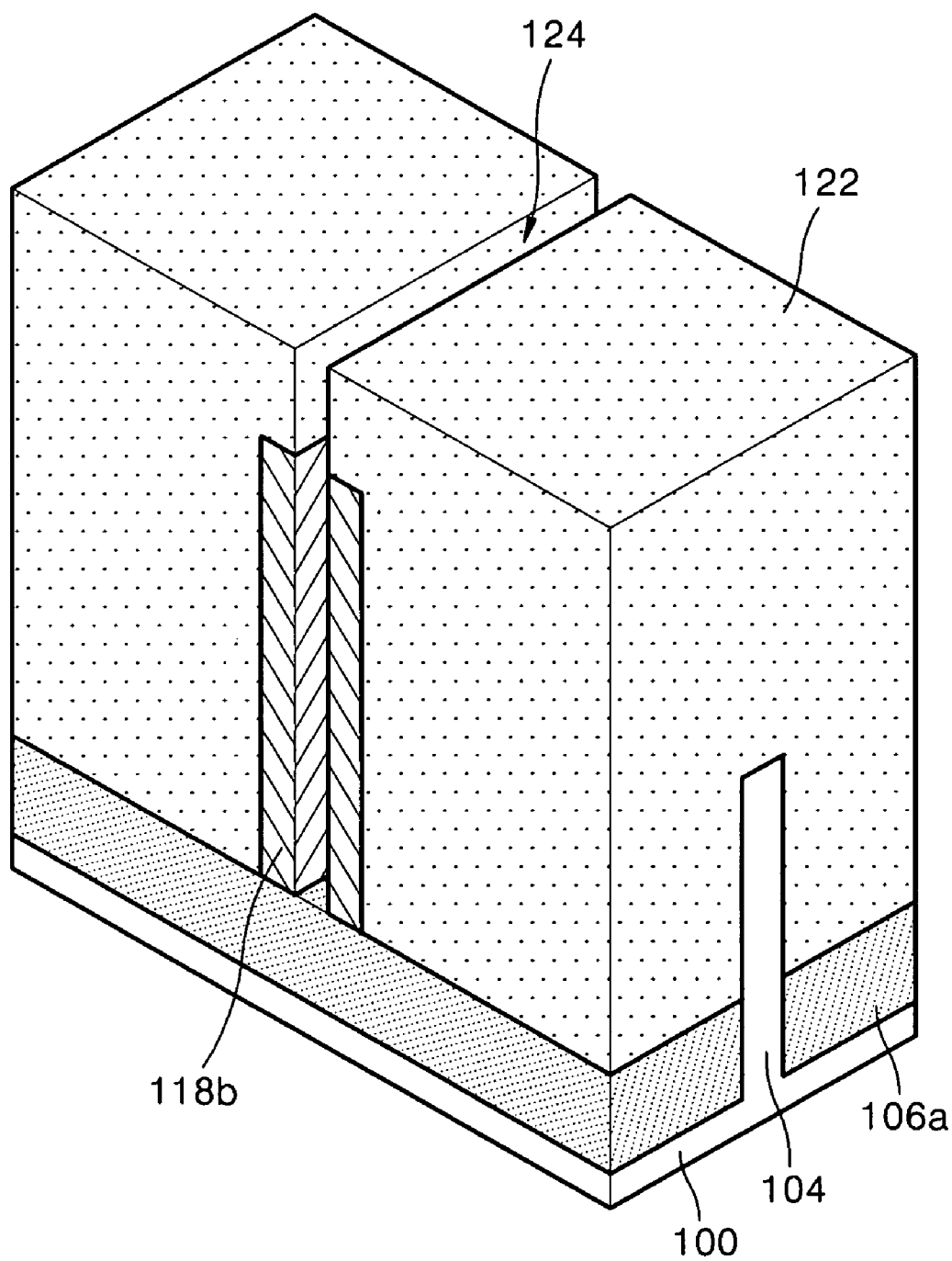

Referring to FIG. 12, the reduced hard mask pattern 120b is removed, such as by phosphoric acid, using the interlayer insulating layer 122 as an etch mask. Referring now to FIG. 13, the gate electrode pattern 118a is etched to expose the recessed device isolation film 106a and the ONO film pattern 110a using the interlayer insulating layers 122 as an etch mask. Accordingly, the gate electrode pattern 118a is separated into two divided control gate electrode patterns 118b and a trench 124 therebetween having substantially the same width as the reduced hard mask pattern 120b. For example, the gate electrode pattern 118a can be etched using $H_2O_2$; a solution of HF and $CH_3COOH$; an etch solution that includes peracetic acid; and/or an SC1 solution. Next, the first and second ONO film patterns 110b are formed by removing the exposed ONO film pattern 110a in the trench 124 (in the same manner as in FIG. 9) to expose both sidewalls and the upper surface of the fin 104.

Figure 14:
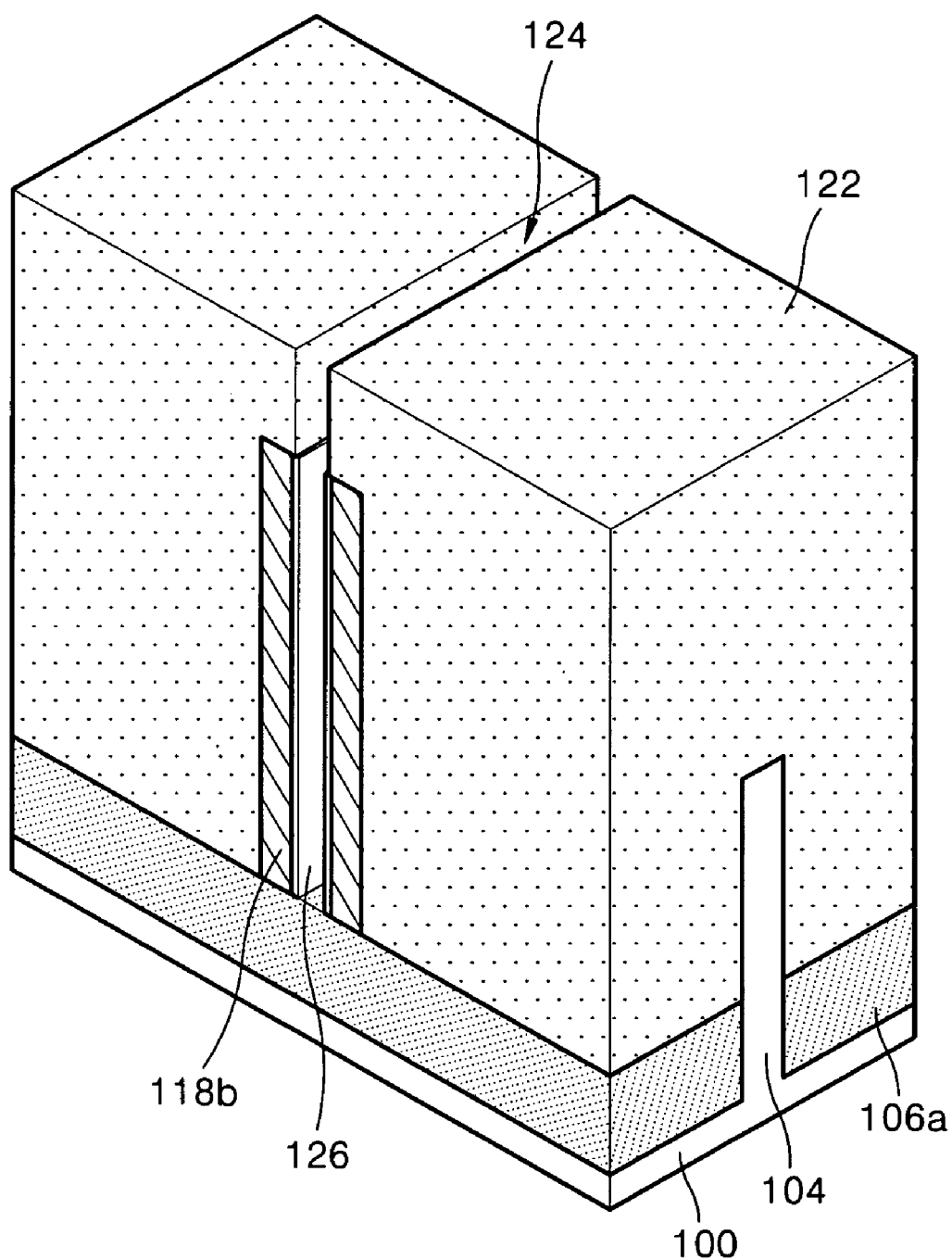

Referring now to FIG. 14, an insulating layer such as thermal oxide film 126 is formed by oxidizing the inner walls of the gate electrode patterns 118b. Although not shown, the thermal oxide film 126 is formed on both sidewalls and the upper surface therebetween of the exposed portion of the fin 104 between the divided gate electrode patterns 118b.

Figure 15:
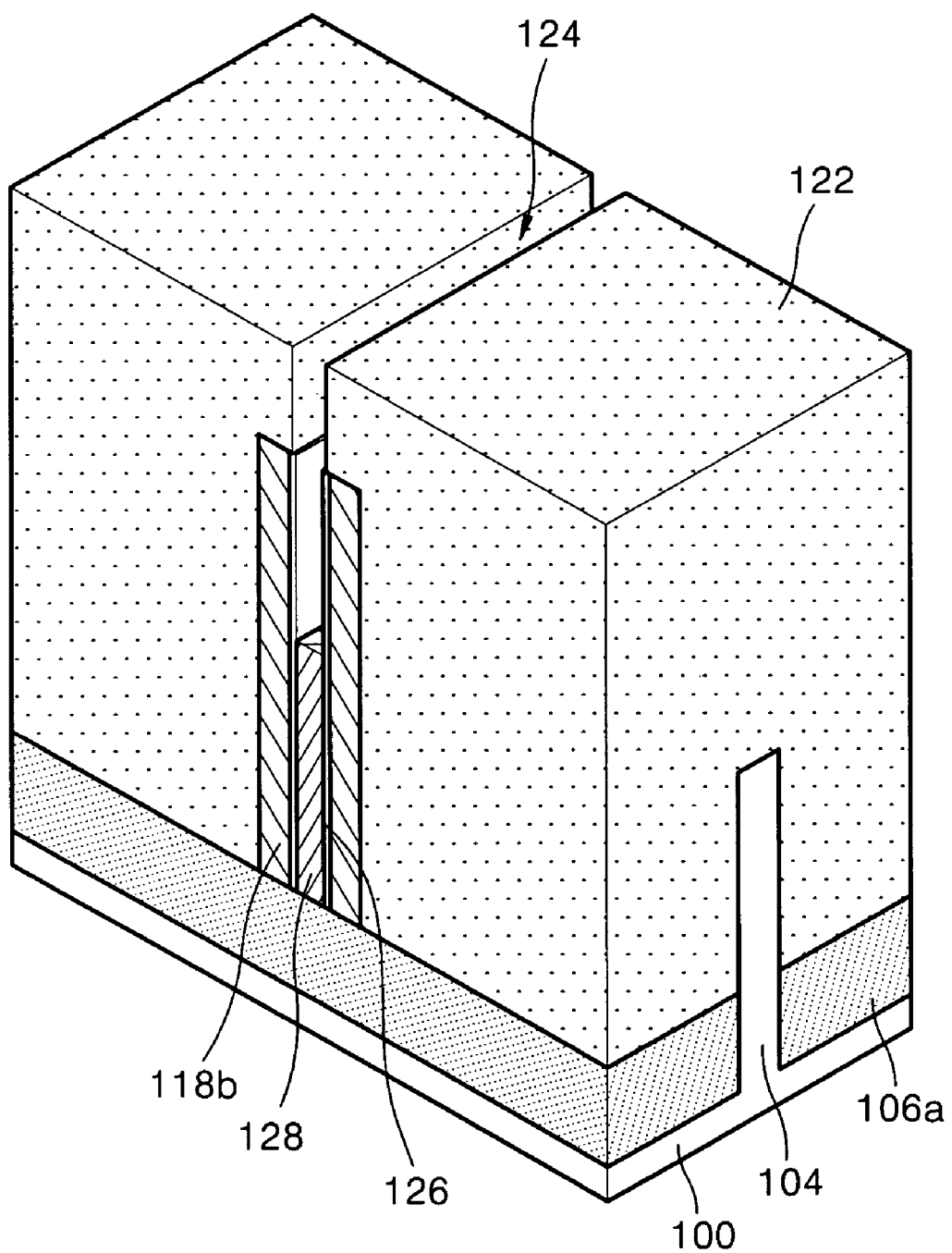

Referring to FIG. 15, a lower part of the trench 124 is filled with a lower gate electrode pattern 128. The lower gate electrode pattern 128 can be a single layer or a multi-layer pattern formed of amorphous silicon, doped polysilicon, poly-SiGe, and/or a material including a conductive metal, such as tungsten, molybdenum, and/or a conductive metal nitride (such as titanium nitride, tantalum nitride, and/or tungsten nitride).

The lower gate electrode pattern 128 can be formed of a polysilicon film providing gap-filling characteristics to reduce and/or prevent void formation. In some embodiments, the lower gate electrode pattern 128 can be a polysilicon film formed using a LPCVD method. When using the LPCVD method, the diffusion rate of the reaction source gas may be increased by reducing pressure by a few Torr using a pump. Therefore, the reaction source gas can be more rapidly transferred to surfaces. Where the reaction rate at the surfaces is slower than the rate at which the reaction gas is introduced, the overall reaction rate may be determined by the reaction rate at the surfaces. Accordingly, a film providing gap filling characteristics can be formed due to improved step coverage. The lower gate electrode pattern 128 can be formed by thermal decomposition of $SiH_4$ gas at a temperature range of about 600° C. to about 700° C. In some embodiments, the temperature range may be about 600° C. to about 650° C., at a pressure in the range of about 0.1 Torr to about 1.0 Torr.

The lower gate electrode pattern 128 can be formed to extend from the isolation film 106a beyond the fin 104. Thus, the lower gate electrode pattern 128 may cover the upper surface and both sidewalls of the fin 104, such that a substantially uniform threshold voltage may be maintained.

Figure 16:
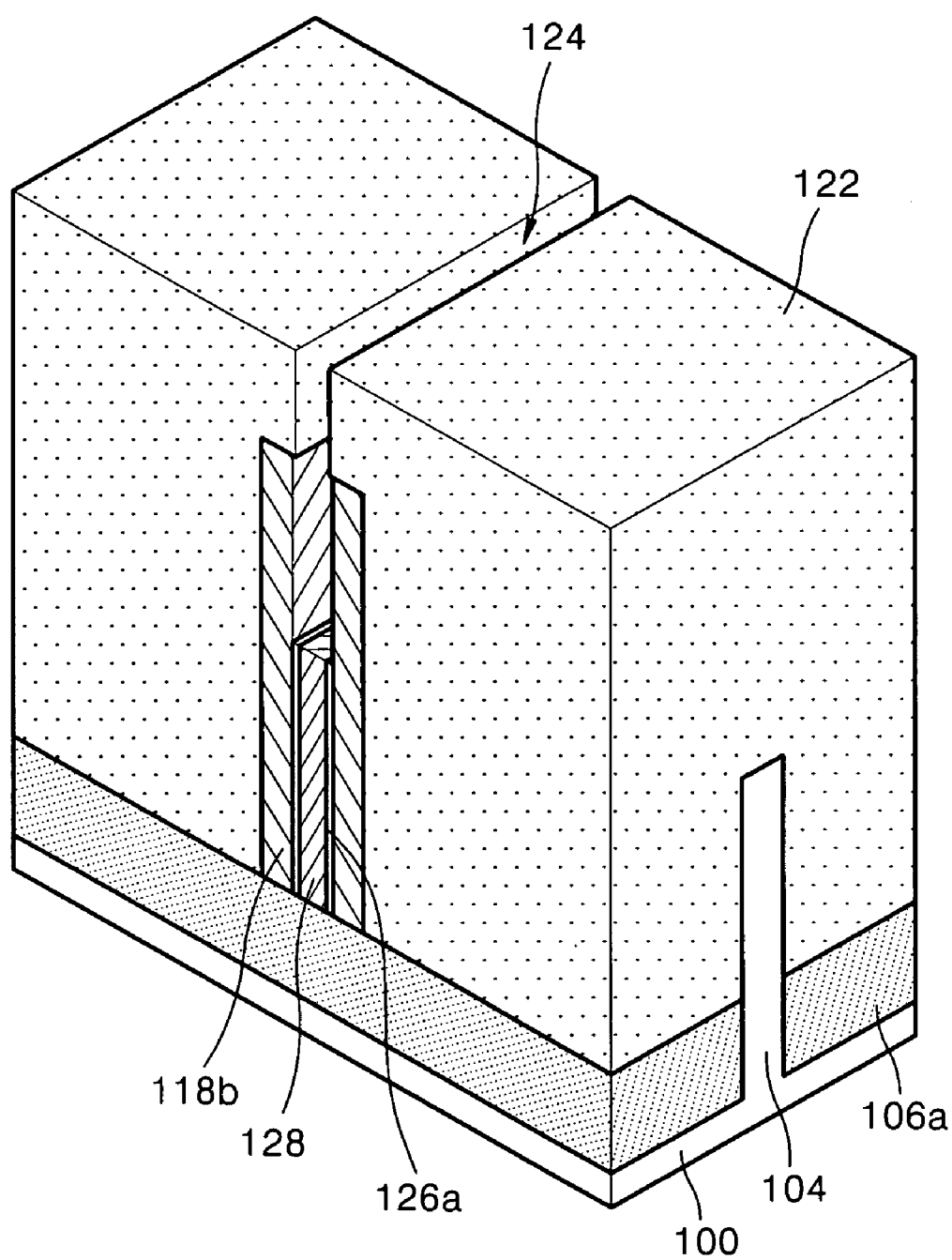

Referring now to FIG. 16, a thermal oxide film pattern 126a is formed by removing portions of the thermal oxide film 126 from the inner walls of the gate electrode patterns 118b above the lower gate electrode pattern 128. The thermal oxide film 126 can be removed using a diluted HF solution, a diluted NHF solution, and/or a BOE, which may be a solution of HF and DI water.

Figure 17:
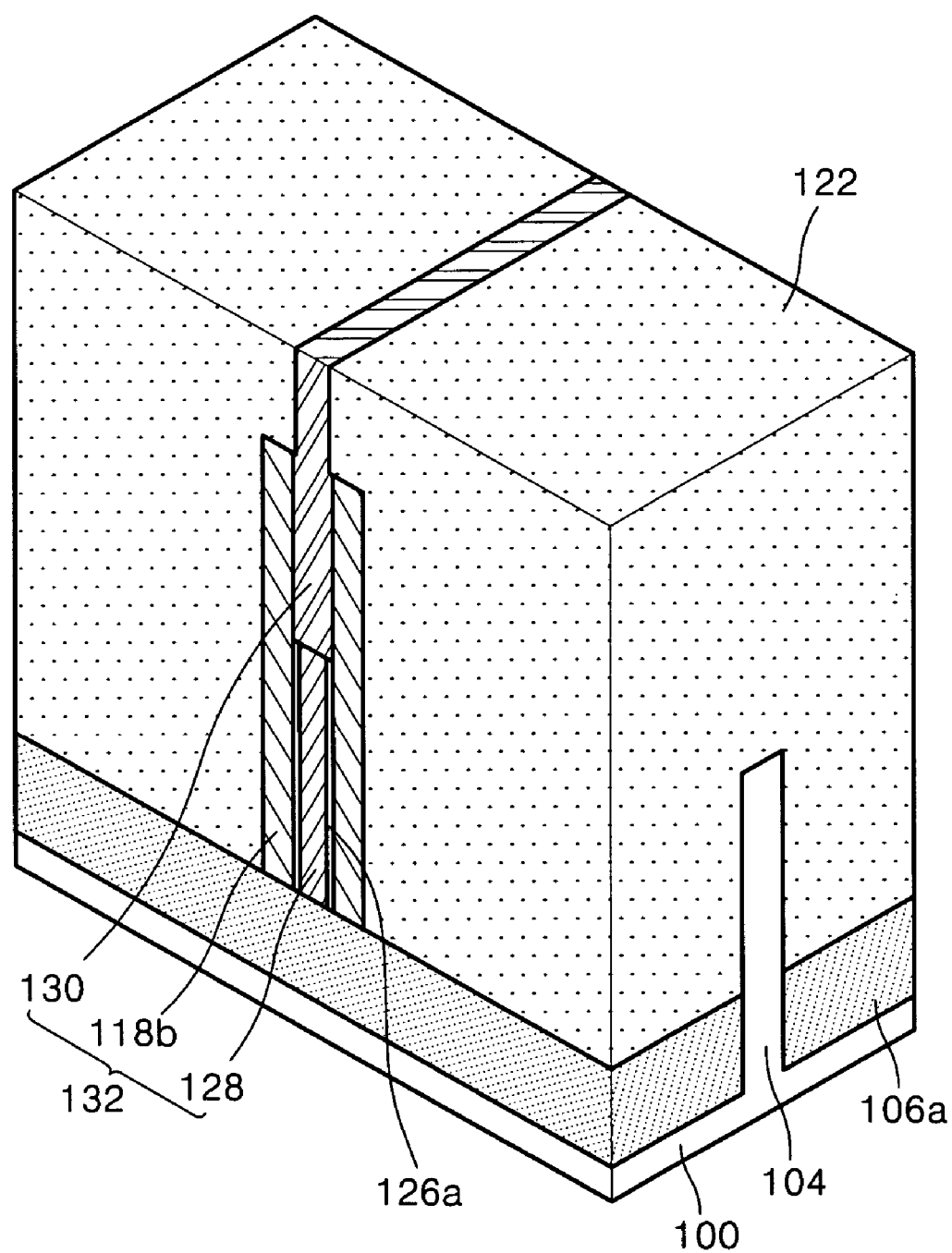

Referring to FIG. 17, the trench 124 above the lower gate electrode pattern 128 is filled to form an upper gate electrode pattern 130. The upper gate electrode pattern 130 can be a single layer or a multi-layer formed of amorphous polysilicon, doped polysilicon, poly-SiGe, and/or a material including a conductive metal, such as tungsten, molybdenum, and/or a conductive metal nitride (such as titanium nitride, tantalum nitride, and/or tungsten nitride). If the upper gate electrode pattern 130 is formed of tungsten and the filled lower gate electrode pattern 128 is formed of polysilicon, a tungsten nitride film (not shown) can be formed therebetween.

The divided gate electrode patterns 118b, the lower gate electrode pattern 128, and the upper gate electrode pattern 130 form a control gate 132 which may be used to provide an inversion layer channel in the fin 104.

Thus, in non-volatile memory devices according to some embodiments of the present invention, a distance between the first and second ONO film patterns 110b can be reduced using the reduced hard mask pattern 120b. Therefore, the size of the non-volatile memory device can also be reduced. Moreover, methods of fabricating non-volatile memory devices according to some embodiments of the present invention may be applicable in a variety of non-volatile memory devices, since the reduced hard mask pattern 120b may be implemented in a FinFET structure.

According to further embodiments of the present invention, a semiconductor memory device having a planar structure will be described. For convenience, components having similar functions as in previous embodiments may have similar names, although their reference numbers and shapes may be different.

Figure 18A:
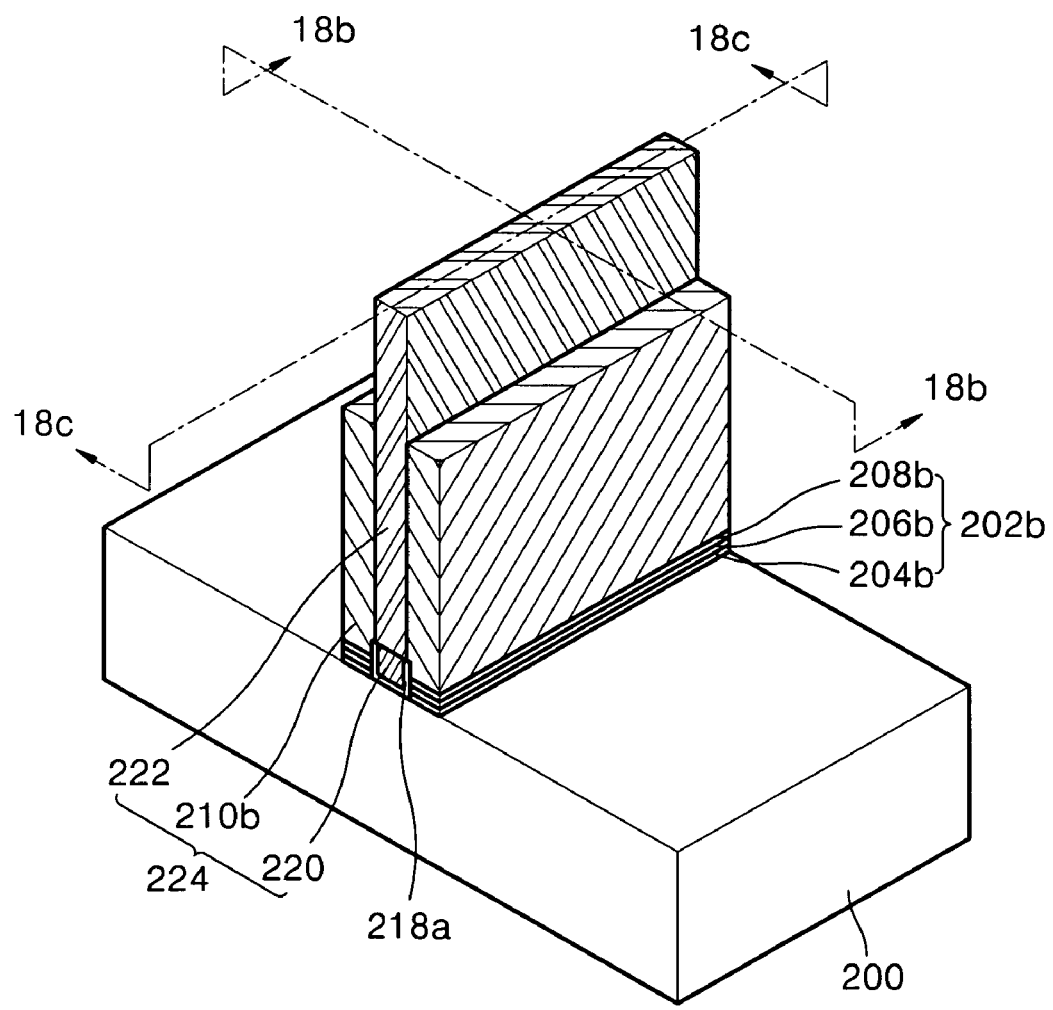
FIG. 18A is a perspective view of a SONOS device having a planar structure according to further embodiments of the present invention.
Figure 18B:
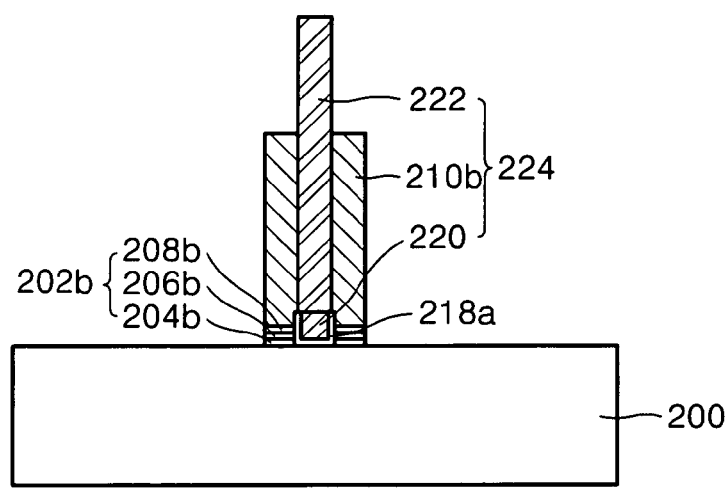
FIG. 18B is a cross-sectional view taken along line 18b-18b of FIG. 18A.
Figure 18C:
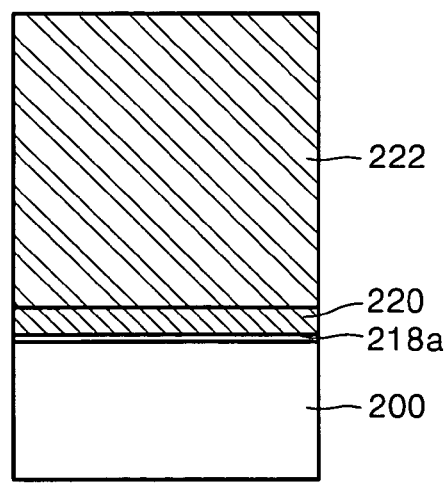
FIG. 18C is a cross-sectional view taken along line 18c-18c of FIG. 18A.

FIG. 18A is a perspective view and FIGS. 18B and 18C are cross-sectional views of a SONOS device having a planar structure according to further embodiments of the present invention. Referring now to FIGS. 18A through 18C, the SONOS device includes a semiconductor substrate 200 having first and second source/drain regions therein and a channel region therebetween, and a gate structure including a control gate 224 on the channel region of the semiconductor substrate 200.

The gate structure includes first and second ONO film patterns 202b, a thermal oxide film pattern 218a, and the control gate 224. The thermal oxide film pattern 218a is formed on adjacent sidewalls of the first and second ONO film patterns 202b and on the channel region therebetween, and between the semiconductor substrate 200 and the control gate 224. That is, the first and second ONO film patterns 202b are separated by the thermal oxide film pattern 218a therebetween. The thermal oxide film pattern 218a also covers both sidewalls and a lower surface of the lower gate electrode pattern 220 and is positioned between the lower gate electrode pattern 220 and divided gate electrode patterns 210b.

The control gate 224 includes the lower gate electrode pattern 220, the divided gate electrode patterns 210b formed on both sides of the filled lower gate electrode pattern 220, and an upper gate electrode pattern 222 formed on the lower gate electrode pattern 220 and between the divided gate electrode patterns 210b.

The lower gate electrode pattern 220 and the thermal oxide film pattern 218a form an insulated gate electrode on the semiconductor substrate 200 which separates the first and second ONO film patterns 202b. The ONO film patterns 202b include a tunnel oxide film pattern 204b, a charge trapping nitride film pattern 206b, and a control oxide film pattern 208b.

When a voltage is applied to the control gate 224, charges, such as electrons or holes, may tunnel through the tunnel oxide film pattern 204b to the nitride film pattern 206b. More specifically, when a positive voltage is applied to the control gate 224, electrons may migrate from the semiconductor substrate 200 and may be trapped in the charge trapping nitride film pattern 206b. On the other hand, when a negative voltage is applied to the control gate 224, holes may migrate from the semiconductor substrate 200 and may be trapped in the charge trapping nitride film pattern 206b.

FIGS. 19 through 28 are perspective views illustrating intermediate steps of fabricating a SONOS devices having a planar structure according to further embodiments of the present invention. Materials described herein may be similar to materials used in previous embodiments.

Figure 19:
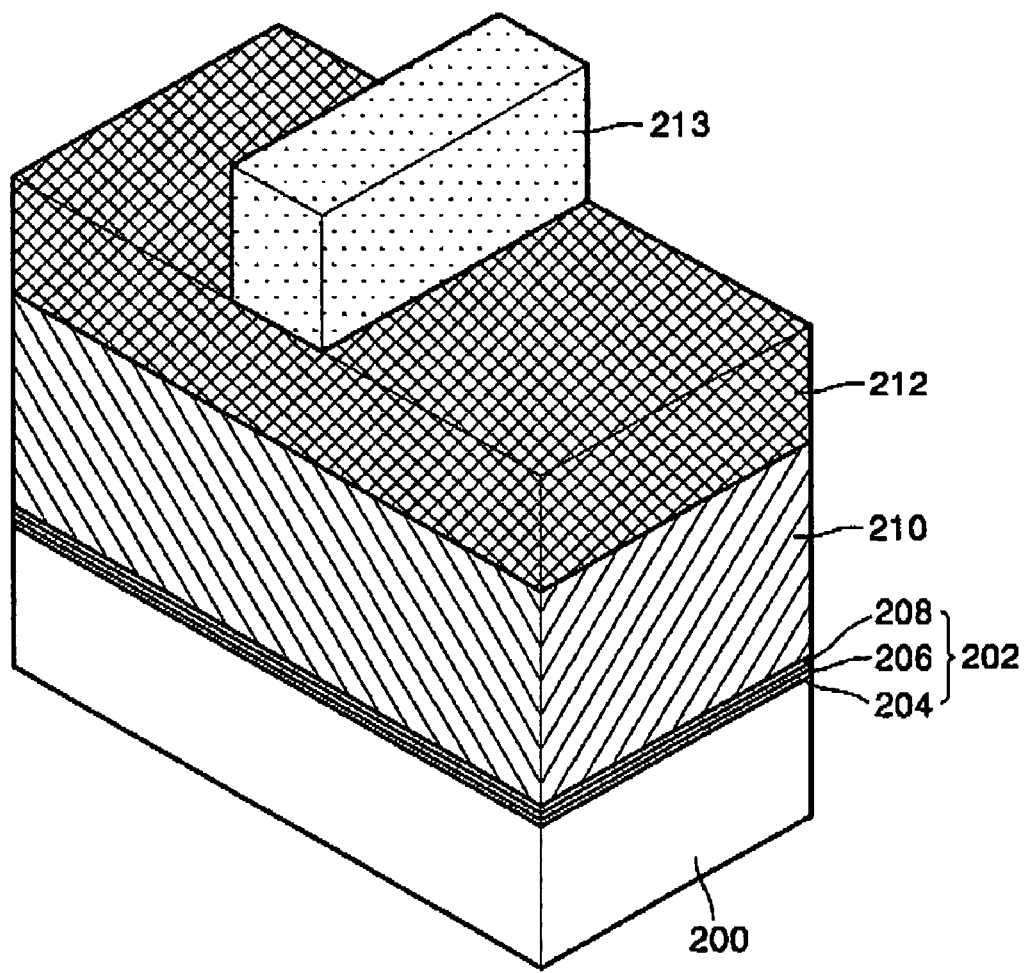
FIGS. 19 through 28 are perspective views illustrating intermediate steps of fabricating SONOS devices having a planar structure as shown in FIG. 18A.

Referring now to FIG. 19, an ONO film 202 including a tunnel oxide film 204, a charge trapping nitride film 206, and a control oxide film 208 (which are sequentially stacked) is formed on an active region of a semiconductor substrate 200 as defined by a device isolation film (not shown). The ONO film 202 is covered by a gate electrode material layer 210 and a mask material layer 212 for use as a hard mask. A third photoresist pattern 213 for etching the layers therebelow is formed to a predetermined width on the mask material layer 212.

Figure 20:
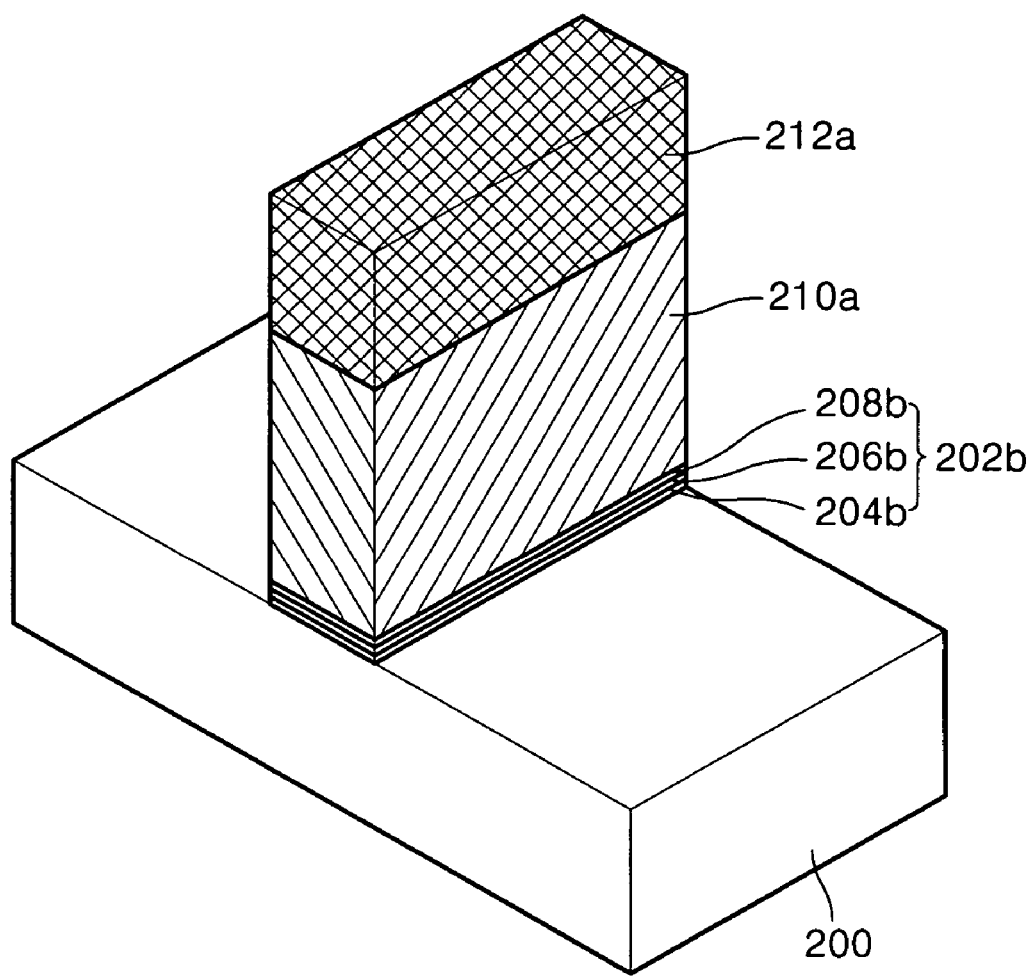
Figure 21:
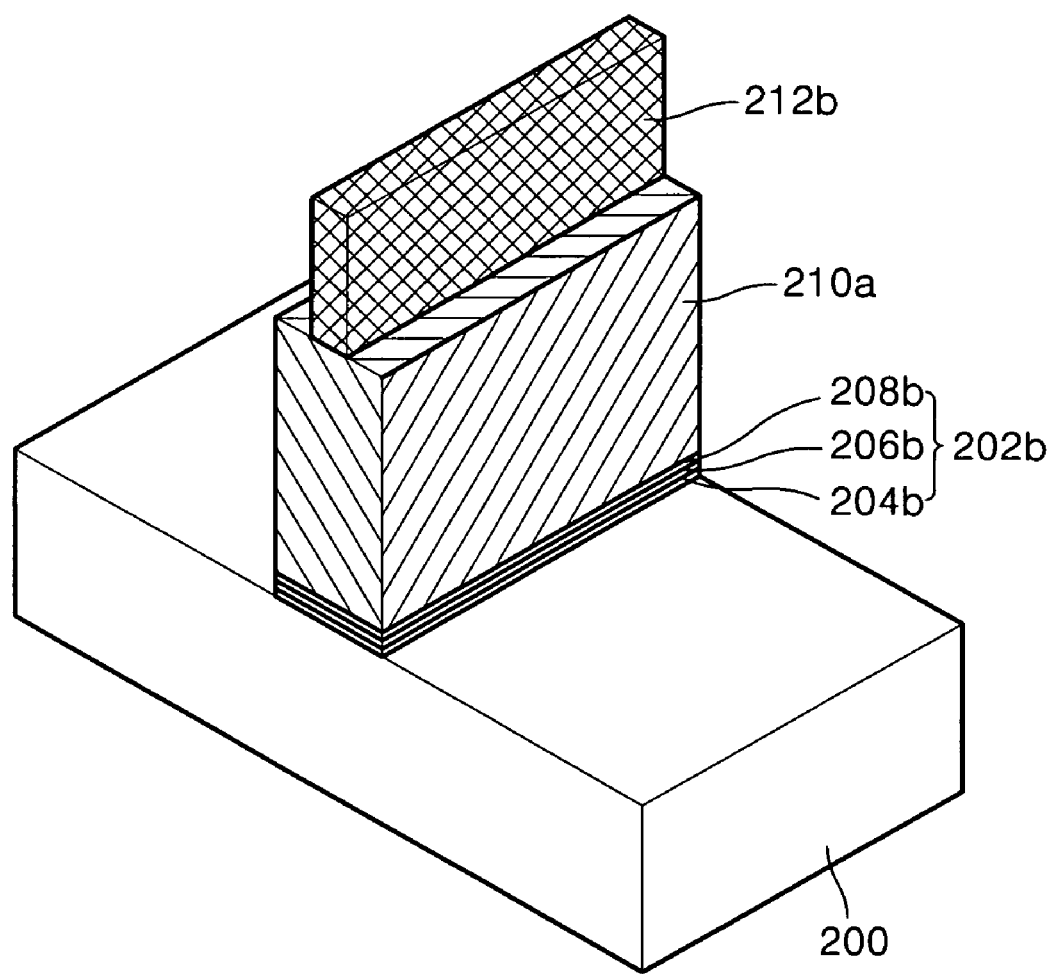

Referring to FIG. 20, a hard mask pattern 212a, a gate electrode pattern 210a, and a ONO film pattern 202b are formed by etching the material layer 212, the gate electrode material layer 210, and the ONO film 202 in the shape of the third photoresist pattern 213 using methods similar to those illustrated in FIG. 9. The third photoresist pattern 213 is then removed, and a reduced hard mask pattern 212b is formed by reducing the width W and/or the length L of the hard mask pattern 212a as shown in FIG. 21, using methods similar to those illustrated in FIG. 10.

Figure 22:
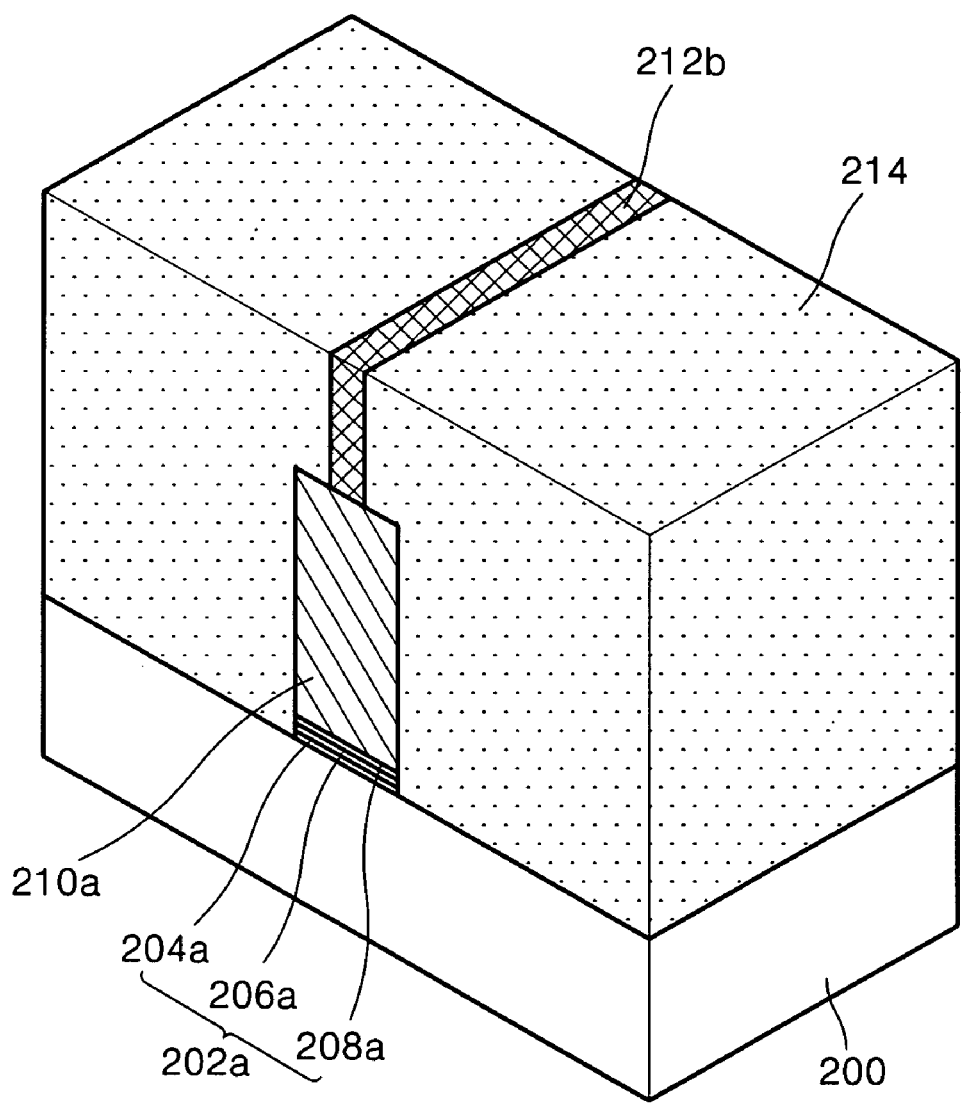
Figure 23:
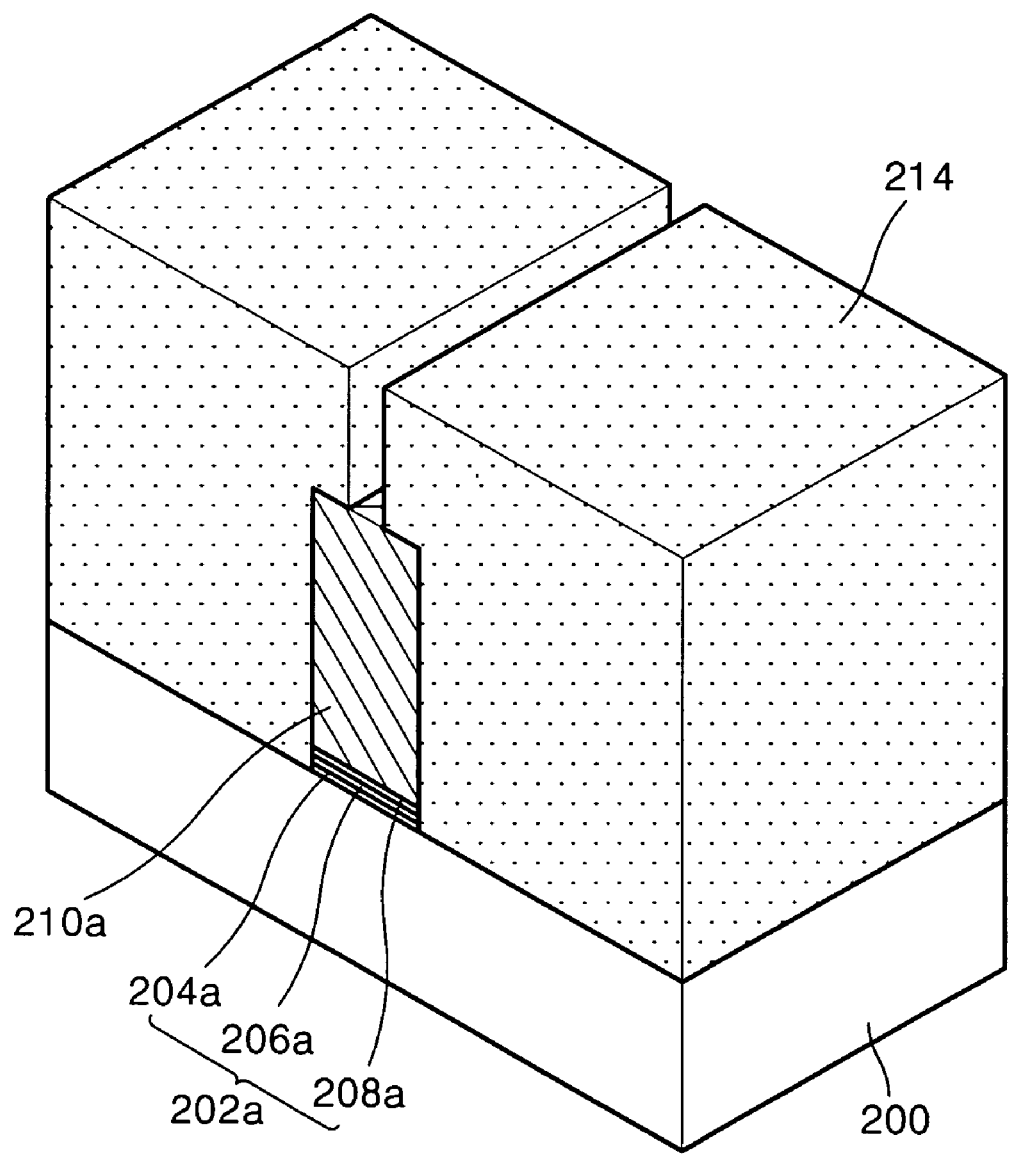

Next, referring to FIG. 22, an interlayer insulating layer 214 is formed on both sidewalls of the reduced hard mask pattern 212b, the gate electrode pattern 210a, and an exposed portion of the semiconductor substrate 200 using methods similar to those illustrated in FIG. 11. Then, as shown in FIG. 23, the reduced hard mask pattern 212b is removed.

Figure 24:
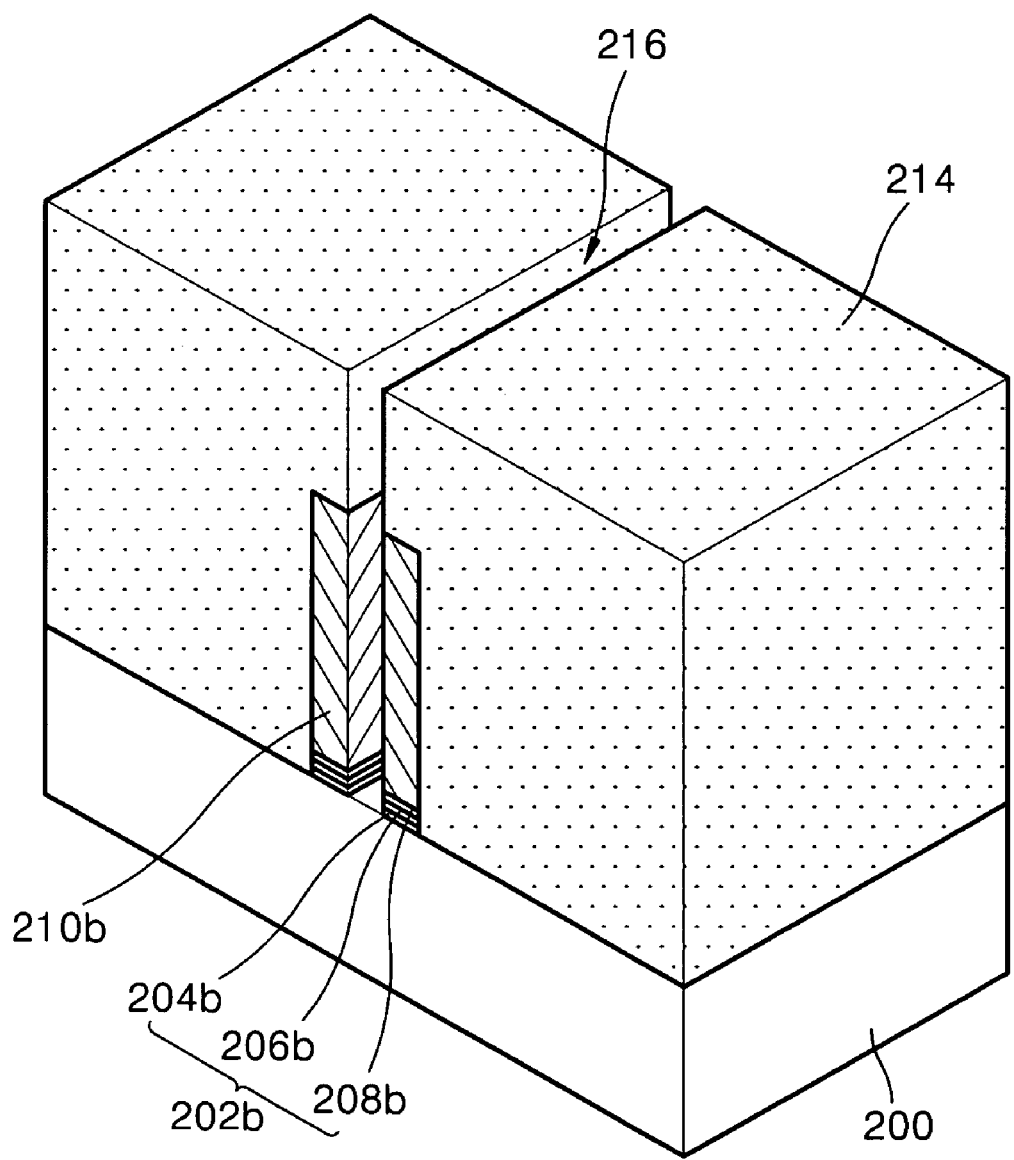

Referring to FIG. 24, gate electrode patterns 210b and ONO film patterns 202b separated by a trench 216 are formed by removing portions of the gate electrode pattern 210a and the ONO film pattern 202a exposed by the interlayer insulating layer 214 using methods similar to those described with reference to FIG. 13.

Figure 25:
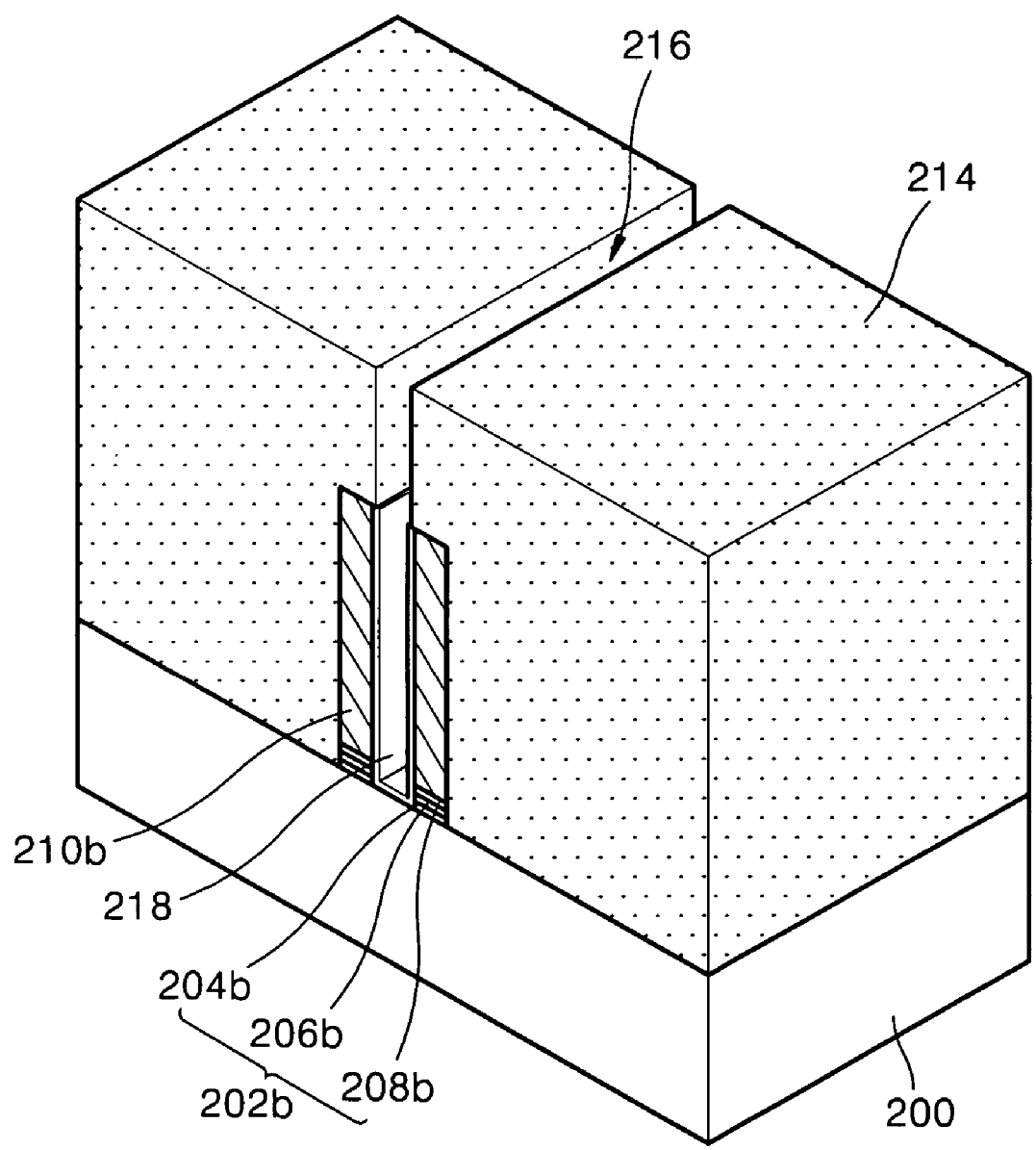

Referring to FIG. 25, a thermal oxide film 218 is formed on inner walls of the gate electrode patterns 210b and on the channel region of the semiconductor substrate 200 at the base of the trench 216 using thermal oxidation methods similar to those described with reference to FIG. 14.

Figure 26:
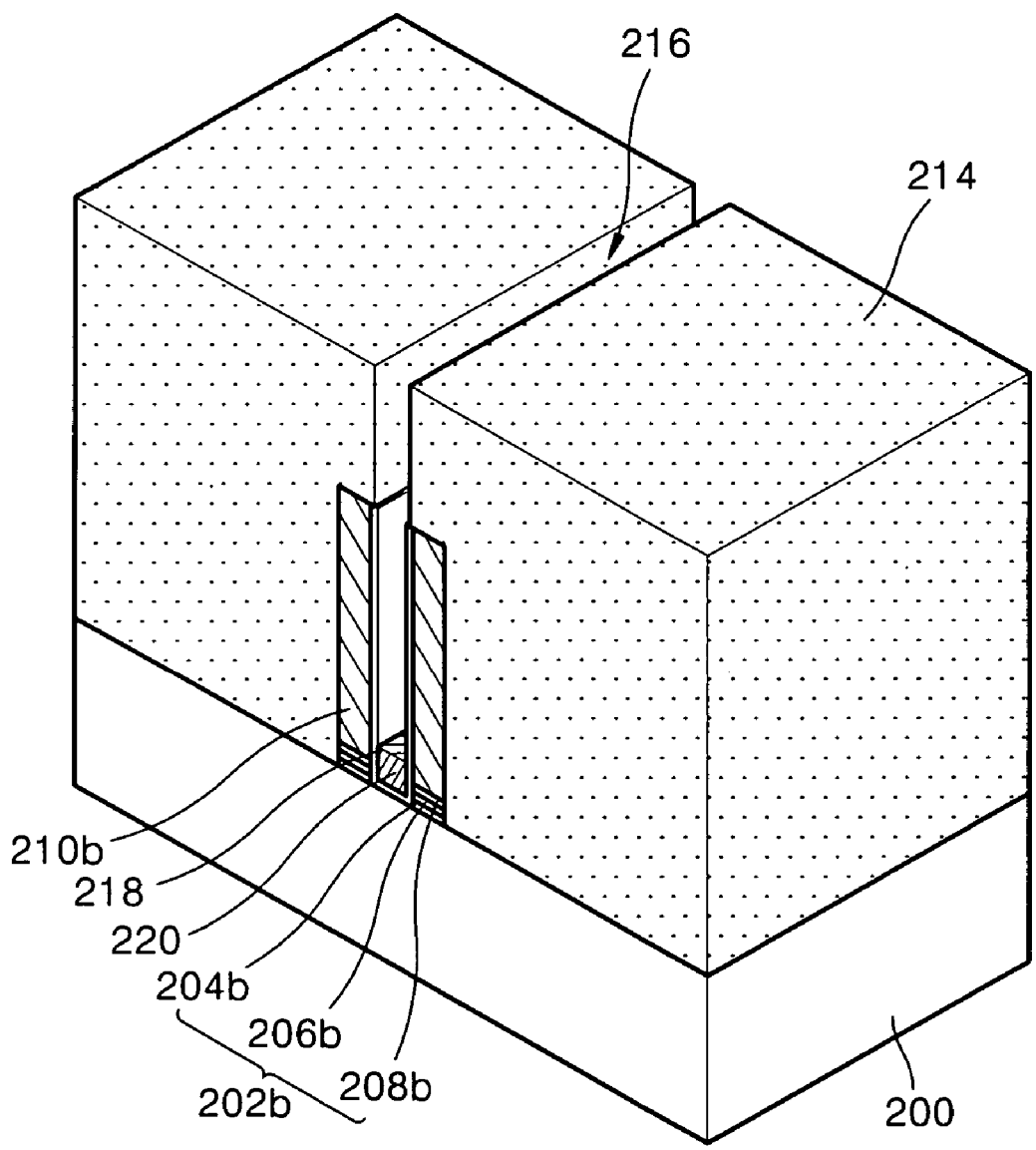
Figure 27:
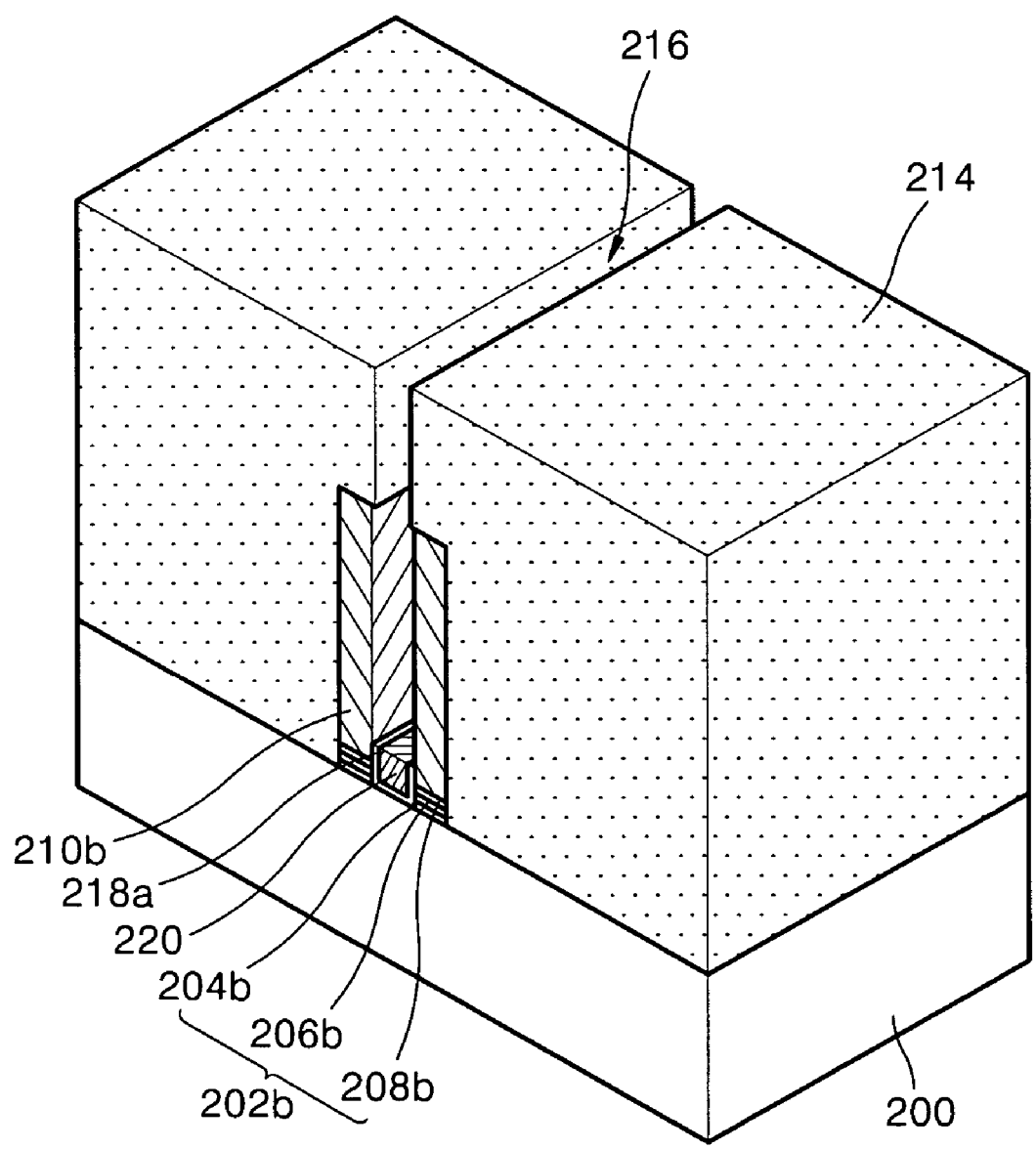

Referring to FIG. 26, a lower part of the trench 216 is filled with a conductive material to form a lower gate electrode pattern 220. Next, referring to FIG. 27, a thermal oxide film pattern 218a is formed by removing portions of the thermal oxide film 218 from the inner walls of the gate electrode patterns 210b above the lower gate electrode pattern 220. The thermal oxide film pattern 218a may extend on sidewalls of the first and second ONO film patterns 202b from the channel region therebeyond.

Figure 28:
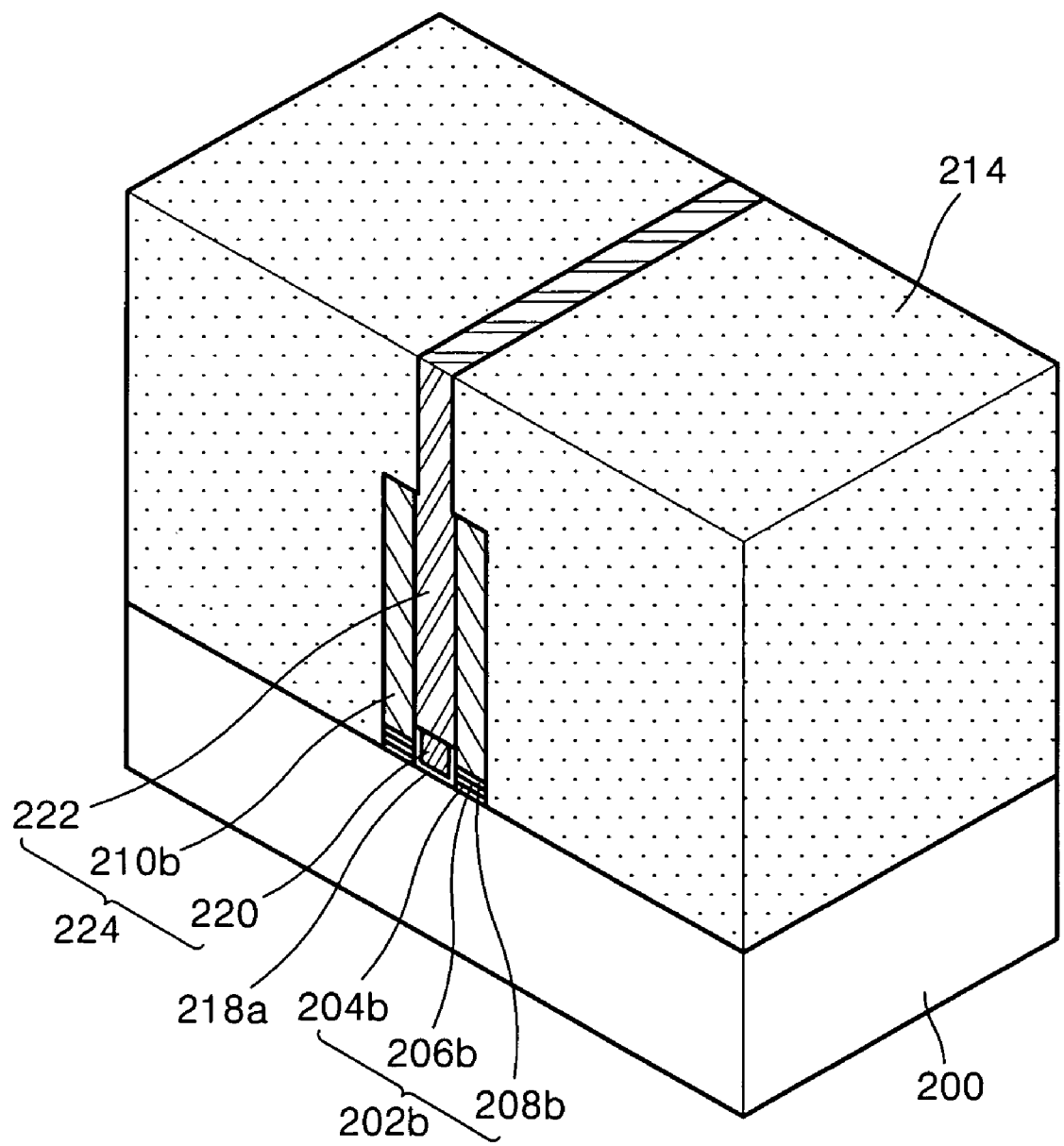

Referring to FIG. 28, the trench 216 above the lower gate electrode pattern 220 is filled to form an upper gate electrode pattern 222. The gate electrode patterns 210b, the lower gate electrode pattern 220, and the upper gate electrode pattern 222 form the control gate 224, which may provide an inversion layer channel near the surface of the semiconductor substrate 200.

Thus non-volatile memory devices according to further embodiments of the present invention can reduce a distance between the first and second ONO film patterns 202b using the reduced hard mask pattern 212b. Accordingly, the size of the non-volatile memory devices can be reduced.

Also, methods of fabricating non-volatile memory devices according to further embodiments of the present invention may be applicable to a variety of non-volatile memory devices, since the reduced hard mask pattern 120b may be implemented in a FinFET.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed:

1. A method of fabricating a semiconductor memory device, the method comprising:
    forming first and second charge storage layers on a channel region between first and second source/drain regions in a semiconductor substrate;
    forming first and second control gate electrodes on the respective first and second charge storage layers;
    forming a first insulating layer on the channel region between the first and second charge storage layers;
    forming second and third insulating layers extending from adjacent inner sidewalls of the first and second charge storage layers beyond the first and second charge storage layers;
    forming a lower gate electrode on the first insulating layer opposite the channel region and between the inner sidewalls of the first and second charge storage layers, wherein the lower gate electrode extends away from the substrate beyond the first and second charge storage layers; and
    forming an upper gate electrode on the lower gate electrode between the first and second control gate electrodes.

2. The method of claim 1, wherein the first, second, and third insulating layers are formed simultaneously.

3. The method of claim 1, wherein the first, second, and third insulating layers comprise a continuous insulating layer.

4. The method of claim 3, wherein forming the first and second charge storage layers comprises:
    forming first and second oxide-nitride-oxide (ONO) layers on the channel region on opposing sidewalls of the gate electrode.

5. The method of claim 4, wherein forming the second and third insulating layers comprises:
    forming the second and third insulating layers on the respective opposing sidewalls of the gate electrode adjacent the first and second ONO layers to form an insulated lower gate electrode separating the first and second ONO layers.

6. The method of claim 1, wherein the forming the second and third insulating layers comprises:
    oxidizing inner sidewalls of the first and second control gate electrodes to form the second insulating layer between the first control gate electrode and the lower gate electrode, and to form the third insulating layer between the second control gate electrode and the lower gate electrode.

7. The method of claim 1, wherein forming the upper gate electrode comprises:
    forming the upper gate electrode to extend from the lower gate electrode beyond the first and second control gate electrodes.

8. The method of claim 1, wherein forming first and second charge storage layers and forming first and second control gate electrodes comprises:
    forming a charge storage layer pattern on the channel region;
    forming a gate electrode pattern on the charge storage layer pattern; and
    removing a middle portion of the gate electrode pattern and a middle portion of the charge storage layer pattern therebeneath to define the first and second charge storage layers and the first and second control gate electrodes.

9. The method of claim 8, wherein removing a middle portion of the gate electrode pattern and a middle portion of the charge storage layer pattern comprises:
    forming a mask pattern on the middle portion of the gate electrode pattern;
    uniformly reducing the mask pattern to form a reduced mask pattern having a predetermined width;
    forming an interlayer insulating layer on the gate electrode pattern at opposite sides of the reduced mask pattern;
    removing the reduced mask pattern to form trench defined by the interlayer insulating layer and exposing the middle portion of the gate electrode pattern; and
    etching the middle portion of the gate electrode pattern and the middle portion of the charge storage layer pattern therebeneath to define the first and second charge storage layers and the first and second control gate electrodes.

10. A method of fabricating a semiconductor memory device, the method comprising:
    forming a fin-shaped active region protruding from a semiconductor substrate, the fin-shaped active region having first and second source/drain regions therein and a channel region therebetween;
    forming first and second charge storage layers on opposing sidewalls of the channel region and on a surface therebetween;
    forming a first insulating layer on the opposing sidewalls and the surface therebetween of the channel region between the first and second charge storage layers;

forming second and third insulating layers extending from adjacent inner sidewalls of the first and second charge storage layers beyond the first and second charge storage layers; and forming a gate electrode on the first insulating layer opposite the channel region on the opposing sidewalls thereof and the surface therebetween and between the inner sidewalls of the first and second charge storage layers to separate the first and second charge storage layers, wherein the gate electrode extends away from the substrate beyond the first and second charge storage layers.

* * * * *

UNITED STATES PATENT AND TRADEMARK OFFICE
CERTIFICATE OF CORRECTION

PATENT NO.        : 7,348,246 B2                                    Page 1 of 1
APPLICATION NO. : 11/268034
DATED             : March 25, 2008
INVENTOR(S)       : Kim et al.

It is certified that error appears in the above-identified patent and that said Letters Patent is hereby corrected as shown below:

On Title Page:
Item 56, Foreign Patent Documents: Please add
    -- KR 10-2002-0065858    A     Fujitsu Limited    08/14/2002 --
    -- JP   2003204068        AO    Fried et al.       07/18/2003 --

Signed and Sealed this

Sixteenth Day of September, 2008

JON W. DUDAS
*Director of the United States Patent and Trademark Office*